United States Patent
Wang et al.

(10) Patent No.: US 11,301,707 B2
(45) Date of Patent: Apr. 12, 2022

(54) TEXTURE RECOGNITION DEVICE AND DRIVING METHOD OF TEXTURE RECOGNITION DEVICE

(71) Applicant: BOE TECHNOLOGY GROUP CO., LTD., Beijing (CN)

(72) Inventors: Haisheng Wang, Beijing (CN); Xue Dong, Beijing (CN); Lei Wang, Beijing (CN); Xiaoliang Ding, Beijing (CN); Yingming Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 78 days.

(21) Appl. No.: 16/764,143

(22) PCT Filed: Apr. 30, 2019

(86) PCT No.: PCT/CN2019/085284
§ 371 (c)(1),
(2) Date: May 14, 2020

(87) PCT Pub. No.: WO2020/220302
PCT Pub. Date: Nov. 5, 2020

(65) Prior Publication Data
US 2021/0232841 A1    Jul. 29, 2021

(51) Int. Cl.
*G06K 9/20* (2006.01)
*G06F 3/041* (2006.01)
(Continued)

(52) U.S. Cl.
CPC ....... *G06K 9/2027* (2013.01); *G02F 1/13338* (2013.01); *G02F 1/133512* (2013.01);
(Continued)

(58) Field of Classification Search
CPC .. G06K 9/2027; G06K 9/0004; G06K 9/2036; G06K 9/209; G06K 9/46;
(Continued)

(56) References Cited

U.S. PATENT DOCUMENTS

2014/0355846 A1* 12/2014 Lee ...................... G06K 9/0004
382/124
2016/0266695 A1* 9/2016 Bae ...................... G06F 3/04166
(Continued)

FOREIGN PATENT DOCUMENTS

CN      105930827 A    9/2016
CN      107832752 A    3/2018
(Continued)

*Primary Examiner* — Abhishek Sarma
(74) *Attorney, Agent, or Firm* — Dave Law Group LLC; Raj S. Dave

(57) ABSTRACT

A texture recognition device and a driving method of a texture recognition device (100) are provided. The texture recognition device has a touch side, and includes: a light source array, an image sensor array and a light valve structure; the image sensor array is configured to receive light emitted from the light source array and then reflected to the image sensor array by a texture for a texture image collection; the light valve structure is disposed on a side of the light source array close to a touch side and is configured to control a first region to be in a light transmission state in response to a control signal, so as to allow light emitted from the light source array to pass through the first region to form a first photosensitive light source in the light transmission state.

19 Claims, 13 Drawing Sheets

(51) Int. Cl.
  *G02F 1/1333* (2006.01)
  *G02F 1/1335* (2006.01)
  *G06K 9/00* (2006.01)
  *G09G 3/36* (2006.01)
  *G06F 3/044* (2006.01)

(52) U.S. Cl.
  CPC ...... *G02F 1/133514* (2013.01); *G06F 3/0412* (2013.01); *G06F 3/04164* (2019.05); *G06K 9/0004* (2013.01); *G06K 9/209* (2013.01); *G06K 9/2036* (2013.01); *G09G 3/3648* (2013.01); *G06F 3/044* (2013.01); *G09G 2300/0426* (2013.01); *G09G 2300/0452* (2013.01)

(58) Field of Classification Search
  CPC .. G06K 9/00067; G06K 1/00; G06F 3/04164; G06F 3/0412; G06F 3/044; G06F 3/0421; G06F 3/0446; G06F 21/32; G02F 1/13338; G02F 1/133512; G02F 1/133514; G09G 3/3648; G09G 2300/0426; G09G 2300/0452; H01L 27/323
  See application file for complete search history.

(56) References Cited

U.S. PATENT DOCUMENTS

2019/0310724 A1* 10/2019 Yeke Yazdandoost ............... G02F 1/13338
2020/0064686 A1* 2/2020 Jiang ................ G02F 1/133617

FOREIGN PATENT DOCUMENTS

| CN | 109031762 A | 12/2018 |
|----|-------------|---------|
| CN | 109508683 A | 3/2019 |

\* cited by examiner

TEXTURE RECOGNITION DEVICE AND DRIVING METHOD OF TEXTURE RECOGNITION DEVICE

CROSS-REFERENCE TO RELATED APPLICATIONS

This patent application is the National Stage Entry of PCT/CN2019/085284 filed on Apr. 30, 2019, the entire disclosures of which are incorporated herein by reference as part of the present application.

TECHNICAL FIELD

Embodiments of the present disclosure relate to a texture recognition device and a driving method of a texture recognition device.

BACKGROUND

With increasing popularity of mobile terminals, more and more users use mobile terminals to perform operations such as identity verification, electronic payment and so on. Because of the uniqueness of skin textures such as fingerprint patterns or palm print patterns, fingerprint recognition technology combined with optical imaging is gradually adopted by mobile electronic devices for identity verification, electronic payment, etc. How to design a more optimized texture recognition device is a focus problem in the art.

SUMMARY

At least one embodiment of the present disclosure provides a texture recognition device, the texture recognition device has a touch side, and comprises a light source array, an image sensor array, and a light valve structure; the image sensor array is configured to receive light emitted from the light source array and then reflected to the image sensor array by a texture for a texture collection; and the light valve structure is on a side, close to the touch side, of the light source array and is configured to control a first region to be in a light transmission state in response to a control signal, so as to allow light emitted from the light source array to pass through the first region in the light transmission state to form a first photosensitive light source.

For example, in the texture recognition device provided by at least one embodiment of the present disclosure, the light valve structure is further configured to control a second region different from the first region to be in a light transmission state to allow light emitted from the light source array to pass through the second region in the light transmission state to form a second photosensitive light source, and is configured to allow the first region and the second region to be in the light transmission state at different time.

For example, in the texture recognition device provided by at least one embodiment of the present disclosure, the light valve structure comprises a liquid crystal panel, the liquid crystal panel comprises an array substrate, an opposite substrate, and a liquid crystal layer between the array substrate and the opposite substrate, the liquid crystal panel comprises a pixel array, the pixel array comprises a plurality of pixel units, the control signal comprises a scanning signal and a data signal, each of the pixel units comprises at least one sub-pixel unit, and each sub-pixel unit is configured to control a light transmission state in a pixel region corresponding to the sub-pixel unit according to the scanning signal and the data signal.

For example, in the texture recognition device provided by at least one embodiment of the present disclosure, the image sensor array comprises a plurality of image sensors, and the plurality of image sensors are in the array substrate of the liquid crystal panel.

For example, in the texture recognition device provided by at least one embodiment of the present disclosure, each of the plurality of image sensors is between two adjacent rows of the pixel units, or each of the plurality of image sensors is in the pixel units.

For example, in the texture recognition device provided by at least one embodiment of the present disclosure, each of the plurality of image sensors is between adjacent sub-pixel units, or each of the plurality of image sensors is in the sub-pixel units.

For example, in the texture recognition device provided by at least one embodiment of the present disclosure, each of the pixel units comprises a red sub-pixel unit, a green sub-pixel unit, and a blue sub-pixel unit, and each of the image sensors is between blue sub-pixel units respectively of adjacent pixel units.

For example, in the texture recognition device provided by at least one embodiment of the present disclosure, each of the sub-pixel units comprises a first switch component to receive the scanning signal and the data signal, and each of the image sensors comprises a photosensitive component and a second switch component; the pixel array comprises a first sub-pixel unit, the image sensor array comprises a first image sensor, the first sub-pixel unit and the first image sensor are adjacent to each other, and the second switch component of the first image sensor is at least partially in a same layer as the first switch component of the first sub-pixel unit.

For example, in the texture recognition device provided by at least one embodiment of the present disclosure, the photosensitive component of the first image sensor comprises a first electrode and a lead line electrically connected to the first electrode, the first sub-pixel unit comprises a first pixel electrode electrically connected to the first switch component; the first electrode is in a same layer as the first pixel electrode, or the lead line electrically connected to the first electrode is in a same layer as the first pixel electrode.

For example, in the texture recognition device provided by at least one embodiment of the present disclosure, the array substrate further comprises a base substrate, and an orthographic projection of the photosensitive component of the first image sensor on the base substrate at least partially overlaps with an orthographic projection of the second switch component of the first image sensor on the base substrate.

For example, in the texture recognition device provided by at least one embodiment of the present disclosure, the orthographic projection of the photosensitive component of the first image sensor on the base substrate further at least partially overlaps with an orthographic projection of the first switch component of the first sub-pixel unit on the base substrate.

For example, the texture recognition device provided by at least one embodiment of the present disclosure further comprises a touch structure, the touch structure comprises a touch electrode, the first sub-pixel unit further comprises a first common electrode, and the first common electrode also serves as the touch electrode.

For example, in the texture recognition device provided by at least one embodiment of the present disclosure, the first image sensor further comprises a signal readout line electrically connected to the second switch component, the touch structure further comprises a touch lead line electrically connected to the touch electrode; the signal readout line also serves as the touch lead line, or an orthographic projection of the signal readout line on the base substrate at least partially overlaps with an orthographic projection of the touch lead line on the base substrate.

For example, in the texture recognition device provided by at least one embodiment of the present disclosure, where the signal readout line also serves as the touch lead line, the touch structure further comprises a third switch component, and the touch electrode is electrically connected to the touch lead line through the third switch component.

For example, in the texture recognition device provided by at least one embodiment of the present disclosure, the opposite substrate comprises a black matrix layer, the black matrix layer comprises a plurality of first black matrix regions exposing a plurality of sub-pixel units and a plurality of second black matrix regions exposing a plurality of image sensors, a first light filter pattern is provided in each of the first black matrix regions, the first light filter pattern is configured to form monochromatic light, a second light filter pattern is provided in each of the second black matrix regions, and the second light filter pattern is configured to filter the light emitted from the light source array and then reflected to the image sensor array by the texture.

For example, in the texture recognition device provided by at least one embodiment of the present disclosure, the second light filter pattern is configured to absorb light with a wavelength range of 600 nm to 900 nm.

For example, the texture recognition device provided by at least one embodiment of the present disclosure further comprises a controller, the controller is configured to determine a position of the first region according to a touch position of the texture on the touch side, and control the light valve structure, so as to provide the first photosensitive light source.

For example, in the texture recognition device provided by at least one embodiment of the present disclosure, the controller is further configured to acquire a touch area of the texture on the touch side, so as to determine a size of the first region and a count of the first region.

For example, in the texture recognition device provided by at least one embodiment of the present disclosure, a size of the second region is larger than a size of the first region, a first imaging range of the first photosensitive light source on the image sensor array is in a first ring shape, a second imaging range of the second photosensitive light source on the image sensor array is in a second ring shape, and the second ring shape at least partially covers a ring center part of the first ring shape.

For example, in the texture recognition device provided by at least one embodiment of the present disclosure, the light valve structure is further configured to control a third region different from both of the first region and the second region to be in a light transmission state to allow light emitted from the light source array to pass through the third region in the light transmission state to form a third photosensitive light source, and is configured to allow the first region and the third region to be in the light transmission state at same time; a size of the third region is equal to the size of the first region, a third imaging range of the third photosensitive light source on the image sensor array is in a third ring shape, and the second ring shape further at least partially covers a ring center part of the third ring shape.

For example, in the texture recognition device provided by at least one embodiment of the present disclosure, a size of the second region is equal to a size of the first region, a first imaging range of the first photosensitive light source on the image sensor array is in a first ring shape, a second imaging range of the second photosensitive light source on the image sensor array is in a second ring shape, the first ring shape has only two intersection points with the second ring shape, and two closest points respectively on an inner circle of the first ring shape and an inner circle of the second ring shape are a first point and a second point, and an imaging range in a rectangle shape formed by four sides is used for imaging the texture, taking the two intersection points, the first point and the second point as midpoints of the four sides respectively, or an imaging range formed in a range covered by either of the first ring shape and the second ring shape is used for imaging the texture.

At least one embodiment of the present disclosure provides a driving method of a texture recognition device, the texture recognition device has a touch side and comprises a light source array, an image sensor array, and a light valve structure. The image sensor array is configured to receive light emitted from the light source array and then reflected to the image sensor array by a texture for a texture image collection; and the light valve structure is on a side, close to the touch side, of the light source array; the driving method comprises: controlling a first region of the light valve structure to be in a light transmission state according to a control signal, so as to allow light emitted from the light source array to pass through the first region in the light transmission state to form a first photosensitive light source, the first photosensitive light source forms a first imaging range on the image sensor array, and the first imaging range is used for imaging the texture.

For example, the driving method of a texture recognition device provided by at least one embodiment of the present disclosure further comprises: controlling a second region to be in a light transmission state according to a control signal, so as to allow light emitted from the light source array to pass through the second region in the light transmission state to form a second photosensitive light source, the second region is different from the first region, and the first region and the second region are in the light transmission state at different time; the second photosensitive light source forms a second imaging range on the image sensor array, and both the second imaging range and the first imaging range are used for imaging the texture.

For example, in the driving method of a texture recognition device provided by at least one embodiment of the present disclosure, the light valve structure comprises a liquid crystal panel, the liquid crystal panel comprises an array substrate, an opposite substrate, and a liquid crystal layer between the array substrate and the opposite substrate, the liquid crystal panel comprises a pixel array, the pixel array comprises a plurality of pixel units, each of the pixel units comprises at least one sub-pixel unit, the control signal comprises a scanning signal and a data signal, and the driving method comprises: controlling a light transmission state in a pixel region corresponding to the sub-pixel unit according to the scanning signal and the data signal.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
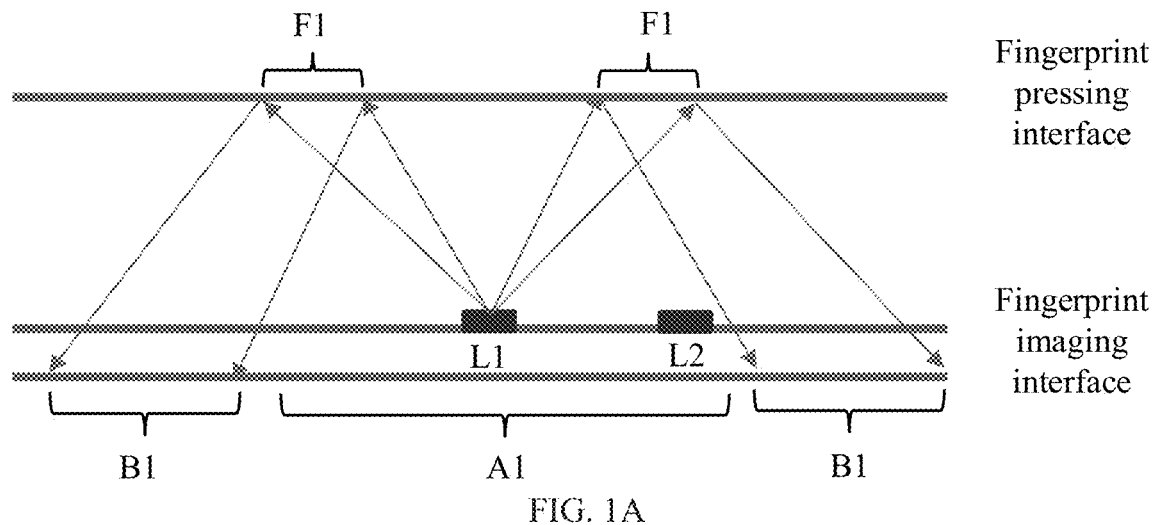
FIG. 1A is a schematic diagram of the principle of fingerprint imaging.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various under-screen texture recognition function components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect" or "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

At present, the narrow border is gradually becoming a mainstream for the design and manufacture of a display device, especially for a portable display device such as a mobile phone. One means to realize the narrow border is to integrate image sensors with a fingerprint recognition function into a display device, which realizes a fingerprint recognition mode under the screen and increases an area of a display region of the display device, and thus increasing the screen proportion.

For example, a point light source, a line light source or a light source with a certain pattern, etc. can be used as a photosensitive light source of an image sensor for fingerprint recognition. In addition, the light source and the image sensor may be arranged in various ways, for example, the light source may be arranged on a side of the image sensor close to the fingerprint touch side, or the light source may be arranged on a same plane as the image sensor, or the light source may also be arranged on a side of the image sensor away from the fingerprint touch side. The arranging modes of the light source and the image sensor can be selected according to different requirements.

The principle of fingerprint recognition is described in the following by taking the case that a point light source is taken as the photosensitive light source of the image sensor, and the light source is arranged on the side of the image sensor close to the fingerprint touch side as an example, but this does not limit the embodiments of the present disclosure.

In a reflective optical fingerprint recognition device, in a fingerprint recognition process, as illustrated in FIG. 1A, when a point light source L1 emits light, the light emitted by the point light source L1 irradiates a fingerprint pressing interface (e.g., an outer surface of a glass screen) at different angles, because of total reflection on the fingerprint pressing interface, a part of the light whose incident angle is larger than or equal to the critical angle θ of the total reflection undergoes total reflection, which results in that this part of the light is not able to exit from the fingerprint pressing interface, thus generating a total reflection region. Correspondingly, a part of the light whose incident angle is smaller than the critical angle θ of the total reflection exits from the fingerprint pressing interface. Therefore, a texture image can be collected by light reflected by the total reflection region, for example, a clear texture image is formed at a region B1 of the fingerprint imaging interface where the image sensor is located, the texture image corresponds to a part of the fingerprint at a region F1, the region F1 is the total reflection region, and the region B1 is an imaging region.

Specifically, for example, when a fingerprint of a user's finger presses the total reflection region F1, ridges of the fingerprint touch a surface of the total reflection region F1, so that the total reflection condition of positions corresponding to the ridges of the fingerprint is destroyed, and therefore light exits at the corresponding positions, so that an original reflection path is changed, while valleys of the fingerprint do not touch the surface of the total reflection region F1, so that the total reflection condition of positions corresponding to the valleys of the fingerprint is not destroyed, therefore light is still totally reflected at the corresponding positions, and thus the original reflection path is not changed. In this way, the light in the total reflection region causes light incident on the fingerprint imaging interface to form a texture image with alternate bright and dark at different positions because of the different influences of the valleys and the ridges of the fingerprint on the total reflection condition.

In addition, because the interference is caused by the light emitted from the fingerprint pressing interface and reflected by fingerprints or the like, or because the light emitted by the light source is reflected to the fingerprint imaging interface by other functional layers before reaching the fingerprint pressing interface, a region A1 of the fingerprint imaging interface becomes an invalid detection region, and this region cannot form an effective texture image. In the invalid region A1, a part of the light emitted by the light source L1 that is reflected to the fingerprint imaging interface by other functional layers before reaching the fingerprint pressing interface and a part of the light emitted by the light source L1 that is almost vertically reflected by the fingerprint pressing interface have higher brightness and are basically in a center of the invalid region A1, thus forming a highlight region. Because the highlight region has a higher brightness, a larger photoelectric signal is generated in a part of the image sensor array corresponding to the highlight region, which is easy to form a residual image, thus the invalid region A1 is also known as a residual image region.

Figure 1B:
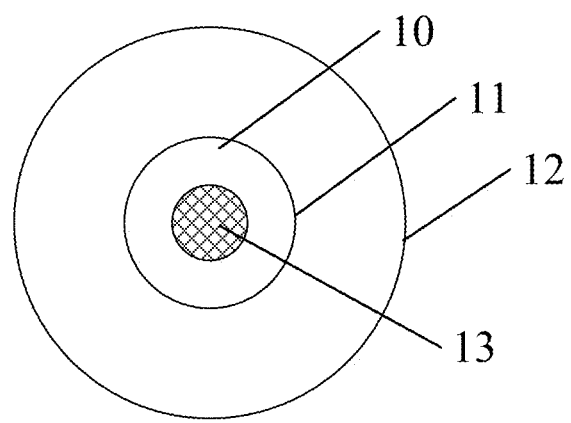
FIG. 1B is a schematic diagram of an imaging range of a point light source.

For example, FIG. 1B illustrates a schematic diagram of an imaging range of a point light source. As illustrated in FIG. 1B, in a photosensitive range of the point light source, an effective imaging range is in an annular shape, that is, in FIG. 1B, an annular region between an inner circle 11 and an outer circle 12 is the effective imaging range which corresponds to the imaging region B1 corresponding to the total reflection region F1 in FIG. 1A; a region within the inner circle 11 of the annular shape (hereinafter referred to as a ring center 10) is the invalid imaging region, corresponding to the invalid region A1 in FIG. 1A; a part of a region (the shaded region) 13 inside the ring center 10 is the highlight region (residual image region), and it is easy to cause a residual image by the highlight region in the image sensor array during imaging.

Figure 1C:
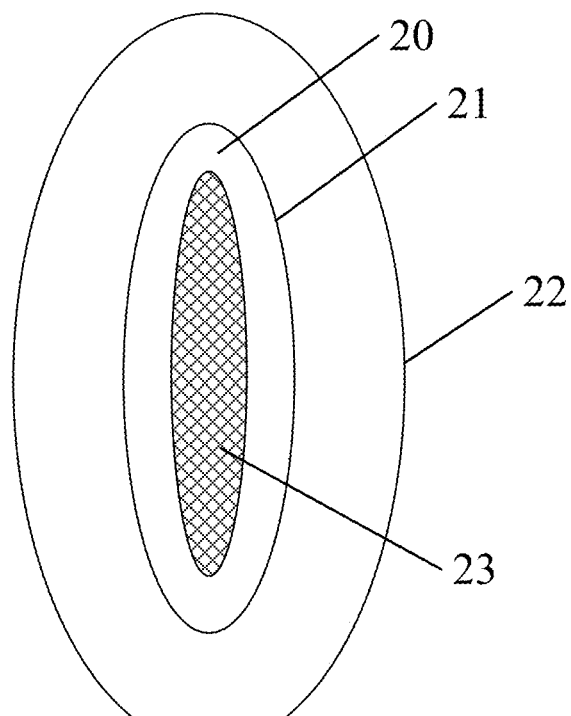
FIG. 1C is a schematic diagram of an imaging range of a line light source.

Similarly, FIG. 1C shows a diagram of an imaging range of a line light source. As illustrated in FIG. 1C, the effective imaging range of a line light source is a racetrack-shaped annular region or a long oval-shaped annular region between an inner circle 21 and an outer circle 22, a ring center 20 is the invalid imaging region, and a part of a region (the shaded region) 23 inside the ring center 10 is the highlight region (residual image region) that is easy to cause a residual image in the image sensor array during imaging.

At present, a display panel of a display device (e.g., mobile phone, etc.) adopting under-screen fingerprint recognition is usually a self-luminous display panel such as an organic light emitting diode (OLED) display panel. For a non-self-luminous display panel such as a liquid crystal display panel (LCD) that relies on light emitted from a backlight source to achieve display, because of the differences in the structure and the display mode, under-screen fingerprint recognition is achieved in different ways.

At least one embodiment of the present disclosure provides a texture recognition device, the texture recognition device has a touch side and comprises a light source array, an image sensor array and a light valve structure; the image sensor array is configured to receive light emitted from the light source array and then reflected to the image sensor array by a texture for a texture image collection; the light valve structure is on a side of the light source array close to the touch side and is configured to control a first region to be in a light transmission state in response to a control signal, so as to allow light emitted from the light source array to pass through the first region in the light transmission state to form a first photosensitive light source.

In the following, the texture recognition device and the driving method of the texture recognition device provided by the embodiments of the present disclosure are described in detail with reference to the accompanying drawings.

Figure 2:
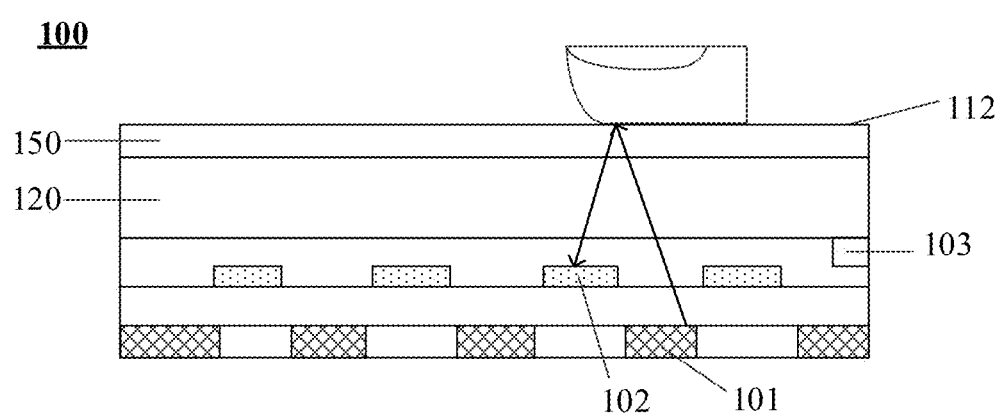
FIG. 2 is a cross-sectional view of a texture recognition device provided by at least one embodiment of the present disclosure.

For example, FIG. 2 is a schematic cross-sectional view of a texture recognition device provided by at least one embodiment of the present disclosure. As illustrated in FIG. 2, a texture recognition device 100 includes a light source array, an image sensor array, and a light valve structure 120. The light source array includes a plurality of light sources 101, and the light sources 101 are arranged in an array within a predetermined region. The image sensor array includes a plurality of image sensors 102, and the plurality of image sensors 102 are arranged in an array within a predetermined region. The image sensor array is configured to receive light emitted from the light source array and then reflected to the image sensor array by a texture for a texture collection. The light valve structure 120 is disposed on a side of the light source array close to a touch side, and is configured to control the first region to be in a light transmission state in response to a control signal, so as to allow light emitted from the light source array to pass through the first region in the light transmission state to form a first photosensitive light source.

For example, when an operator having a texture such as a finger touches a surface of the touch side 112 of the texture recognition device 100, the light emitted by the light source 101 is reflected by the operator and then reaches the image sensor 102, and the image sensor 102 collects texture images of the operator. For example, the operator having the texture may be a hand, in this case, the texture recognized by the image sensor 102 is a skin texture, such as a fingerprint, a palm print, etc. In addition, the operator having the texture may also be non-living bodies with a certain texture, such as objects with a certain texture made of materials such as resin and the like, and no limitation is imposed to this in the embodiments of the present disclosure.

For example, the light valve structure 120 comprises a structure which can realize different light transmittances at different positions under control, such as a liquid crystal light valve, an electrochromic light valve, an electronic ink light valve and the like. For example, in the case where the light valve structure 120 is the liquid crystal light valve, the light valve structure 120 includes a liquid crystal material and a plurality of electrodes configured to drive the liquid crystal material at different positions to deflect, so that the liquid crystal material can be correspondingly deflected by applying different voltages to the electrodes, so as to change the light transmittance of the liquid crystal light valve and realize the function of light valve. A light incident side of the liquid crystal light valve (a side on which the light source array is arranged) is provided with a first polarizer and a light exit side of the liquid crystal light valve is provided with a second polarizer, and the polarization direction of the first polarizer and the polarization direction of the second polarizer are perpendicular to each other. Combined with the first polarizer and the second polarizer, for example, when the molecular alignment direction of the liquid crystal material is parallel to the propagation direction of light, the liquid crystal light valve at the corresponding position transmits light, and when the molecular alignment direction of the liquid crystal material is perpendicular to the propagation direction of light, the liquid crystal light valve at the corresponding position does not transmit light.

For example, in the case where the light valve structure 120 is the electrochromic light valve, the light valve structure 120 includes an electrochromic material and a plurality of electrodes configured to drive the electrochromic material at different positions to change color, so that the color of the electrochromic material can be changed by applying different voltages to the electrodes, so as to change the light transmittance of the electrochromic material and realize the function of light valve. For example, the electrochromic material can be driven by different voltages to change between a transparent state and a dark state. When the electrochromic material is in the transparent state, the corresponding position transmits light, and when the electrochromic material is in the dark state, the corresponding position does not transmit light.

For example, when the light valve structure 120 is the electronic ink light valve, the light valve structure 120 includes an electronic ink layer (e.g., including electronic ink microcapsules) and a plurality of electrodes configured to drive micro-particles (e.g., black particles) in the electronic ink layer to move, so that particles in the electronic ink can move by applying different voltages to the electrodes to change the light transmittance of the electronic ink layer and realize the function of light valve. For example, the electronic ink layer can be driven by different voltages to change between a transparent state and a dark state. When the electronic ink layer is in the transparent state, the corresponding position transmits light, and when the electronic ink layer is in the dark state, the corresponding position does not transmit light.

Figure 3A:
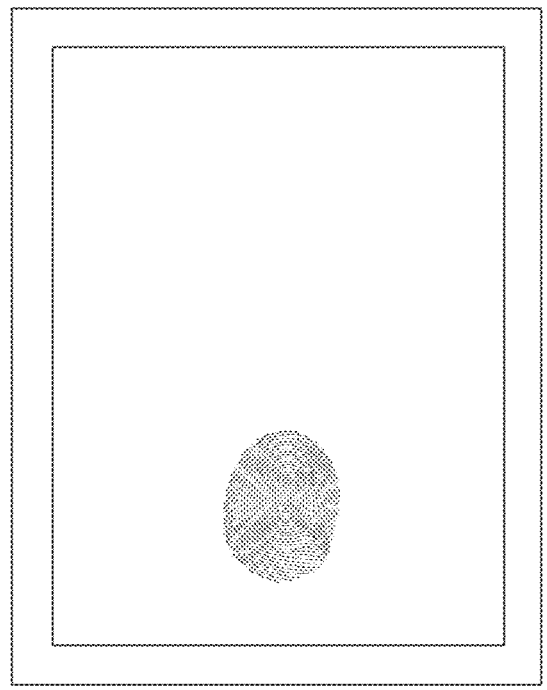
FIG. 3A is a schematic diagram of a texture recognition device touched by a texture provided by at least one embodiment of the present disclosure.
Figure 3B:
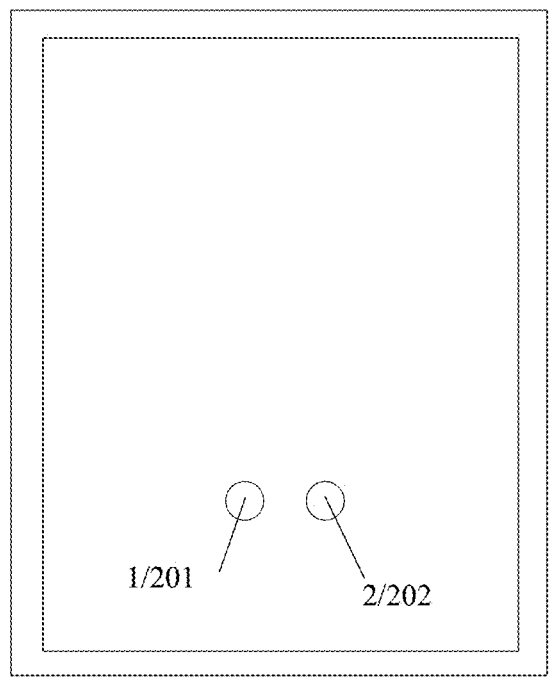
FIG. 3B is a schematic diagram of a photosensitive light source formed by a texture recognition device provided by at least one embodiment of the present disclosure.

The operation process of the texture recognition device 100 is as follows. In the process of an operator having a texture such as an operator's finger touching the touch side 112 of the texture recognition device 100, as illustrated in FIG. 3A, the texture recognition device 100 starts the texture collection. In the process of the texture collection performed by the texture recognition device 100, as illustrated in FIG. 3B, the light valve structure 120 controls the first region 1 to be in a light transmission state in response to a control signal, so as to allow the light emitted from the light source array to pass through the first region 1 to form a first photosensitive light source 201.

For example, in some embodiments, as illustrated in FIG. 2, the texture recognition device 100 further includes a controller 103. As illustrated in FIG. 3A and FIG. 3B, for example, in at least one embodiment, the controller 103 can determine the position of the first region 1 according to a touch position of the texture on the touch side 112, and control the light valve structure 120 to allow the first region 1 to be in the light transmission state, so as to provide the first photosensitive light source 201.

For example, the first photosensitive light source 201 includes one or more light sources 101. For example, the controller 103 is further configured to acquire a touch area of the texture on the touch side 112 to determine the size of the first region 1 and the number of the first region 1, thereby also determining the number of light sources 101 corresponding to the first region 1 (i.e., the number of light sources 101 included in the first photosensitive light source 201) and the number of first photosensitive light sources 201 (described in detail later). For example, the texture recognition device 100 further includes a touch structure, and the touch position and the touch area of the texture on the touch side 112 may be obtained by the touch structure.

For example, referring to FIG. 2, the texture recognition device 100 further includes a cover plate 150, for example, the cover plate 150 is a glass cover plate which can encapsulate and protect the texture recognition device 100. For example, a surface of the cover plate 150 is the touch side 112. When an operator with a texture such as a finger touches the touch side 112 of the texture recognition device 100, the light emitted by the light source 101 is reflected by the operator and reaches the image sensor 102, and the image sensor 102 can collect texture images of the operator.

Figure 4:
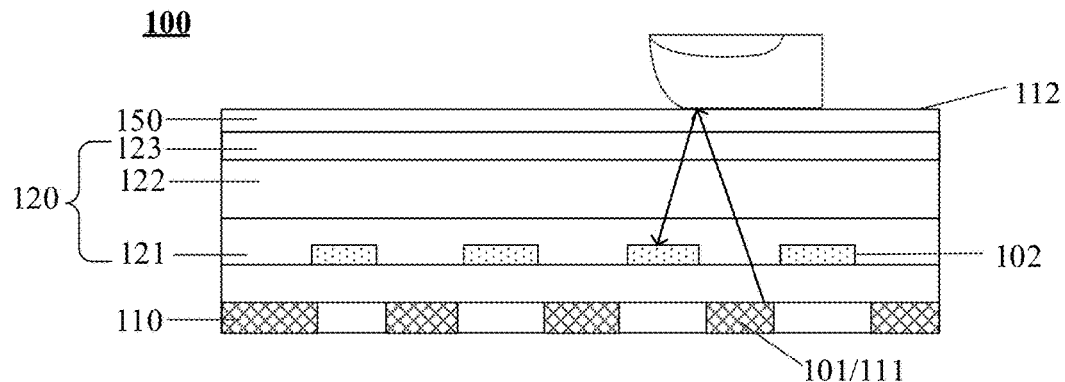
FIG. 4 is a schematic cross-sectional view of a liquid crystal display device provided by at least one embodiment of the present disclosure.
Figure 6A:
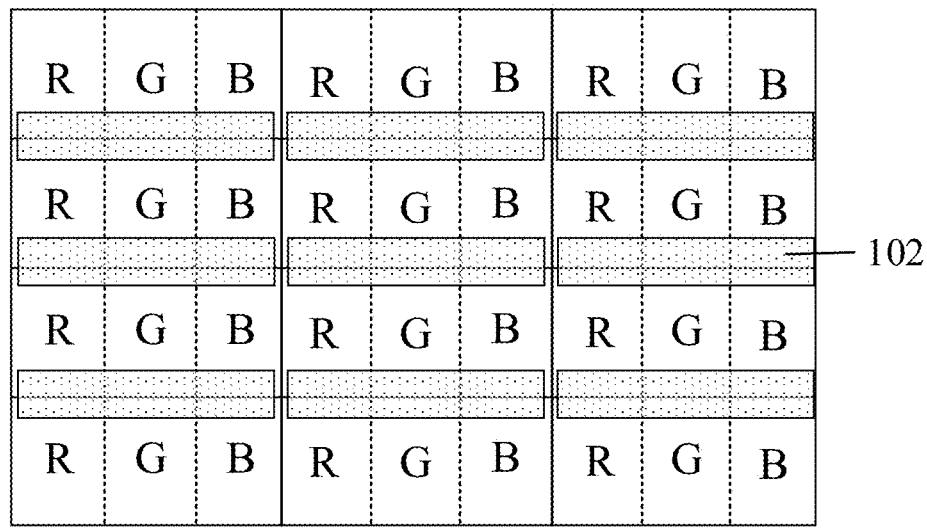
FIG. 6A is a schematic diagram showing an arrangement of a pixel array and image sensors in a liquid crystal display device provided by at least one embodiment of the present disclosure.

For example, in some embodiments, as illustrated in FIG. 4, the light valve structure 120 is a liquid crystal panel. In this case, the texture recognition device 100 is implemented as a liquid crystal display device. The following description takes the liquid crystal panel as an example of the light valve structure, but the embodiments of the present disclosure are not limited to this. The liquid crystal panel includes an array substrate 121, an opposite substrate 123, and a liquid crystal layer 122 between the array substrate 121 and the opposite substrate 123. The liquid crystal panel includes a pixel array, for example, FIG. 6A shows a schematic planar view of a pixel array. As illustrated in FIG. 6A, the pixel array includes a plurality of pixel units, each of the pixel units includes at least one sub-pixel unit (illustrated as three sub-pixel units R, G, B in the figure), the control signal includes a scanning signal and a data signal, and each sub-pixel unit is configured to control the light transmission state in a pixel region corresponding to the sub-pixel unit according to the scanning signal and the data signal. For example, the first region 1 includes a pixel region corresponding to at least one sub-pixel unit.

For example, the liquid crystal display device includes a backlight 110, the backlight 110 is disposed on a non-display side of the liquid crystal panel and is configured to provide a planar light source for the liquid crystal panel. For example, the backlight 110 is a direct type backlight, which includes a plurality of sub-light sources 111 arranged in an array, and may further include a diffuser plate (not illustrated) as required. Light emitted from these sub-light sources 111 is homogenized by the diffuser plate and then enters the liquid crystal panel for display. For example, the plurality of sub-light sources 111 of the backlight 110 are implemented as the plurality of light sources 101 of the light source array. That is, the plurality of sub-light sources 111 of the backlight 110 also serve as the plurality of light sources 101 of the light source array for providing photosensitive light sources. For example, the sub-light source 111 is a light emitting diode (LED). For example, in the backlight 110, the plurality of sub-light sources 111 are arranged in an array, and may be divided into a plurality of regions to be controlled, or may be independently controlled respectively. For example, the direct backlight can be controlled by combining the local dimming (LD) technology, thereby improving the display quality of the display device. The local dimming technology divides the entire backlight source into a plurality of backlight regions which can be driven independently, and each backlight region comprises one or more LEDs. The driving currents of the LEDs of the backlight regions corresponding to different parts of the display screen are automatically adjusted according to the gray scale required to be displayed by the different parts of the display screen, so that the brightness of each region in the backlight can be adjusted independently, and thus the contrast of a display image can be improved. For example, the local dimming of the backlight 110 may be realized by a control circuit.

For example, as illustrated in FIG. 4, the plurality of image sensors 102 of the image sensor array are disposed in the array substrate 121 of the liquid crystal panel. Thus, the plurality of image sensors 102 and the liquid crystal panel can be formed in a same process.

For example, in the array substrate 121 of the liquid crystal panel, each of the image sensors is disposed between adjacent pixel units or disposed in the pixel units. For example, in other embodiments, the image sensor may also be disposed between adjacent sub-pixel units or disposed in the sub-pixel units.

For example, in some examples, a distance between two adjacent rows of pixel units is larger than a distance between two adjacent columns of pixel units. In this case, in order to facilitate device arrangement, the image sensor 102 may be disposed between adjacent two rows of pixel units. For example, as illustrated in FIG. 6A, each pixel unit of the liquid crystal panel includes a red sub-pixel unit R, a green sub-pixel unit G, and a blue sub-pixel unit B, each image sensor 102 is disposed between two adjacent rows of pixel units, and one image sensor 102 is disposed between every adjacent two pixel units.

Figure 6B:
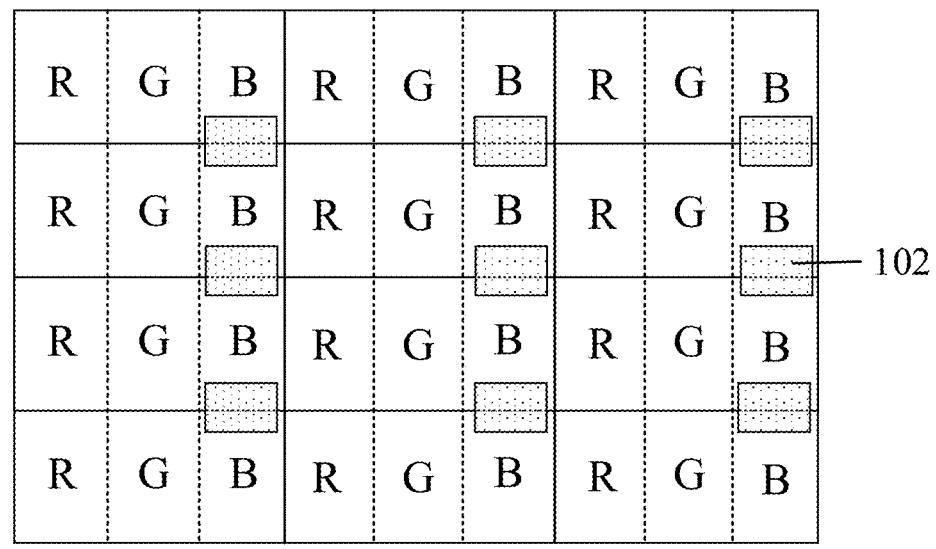
FIG. 6B is a schematic diagram showing another arrangement of a pixel array and image sensors in a liquid crystal display device provided by at least one embodiment of the present disclosure.

For example, in some examples, the blue sub-pixel unit has the smallest influence on the display effect of the liquid crystal panel compared with the red sub-pixel unit R and the green sub-pixel unit G, and in this case, the image sensor 102 may be disposed between the blue sub-pixel units B respectively of adjacent pixel units. For example, as illustrated in FIG. 6B, one image sensor 102 is disposed between blue sub-pixel units B respectively of every two adjacent pixel units. In this case, an effective light emitting area of the blue sub-pixel unit B can be designed to be relatively small, or when the image sensor 102 is formed between the blue sub-pixel units B respectively of adjacent pixel units in the manufacture process of the texture recognition device, even if the structural arrangement of the blue sub-pixel units B is affected, the display effect of the liquid crystal panel is not affected.

For example, in some examples, the image sensor 102 may be disposed between two adjacent columns of pixel units or between two adjacent columns of sub-pixel units, and the embodiments of the present disclosure are not limited in this aspect. In addition, it should be noted that the above definitions of rows and columns are interchangeable. For example, when the liquid crystal panel in the figure rotates, the rows and the columns of the pixel array also change accordingly.

Figure 5:
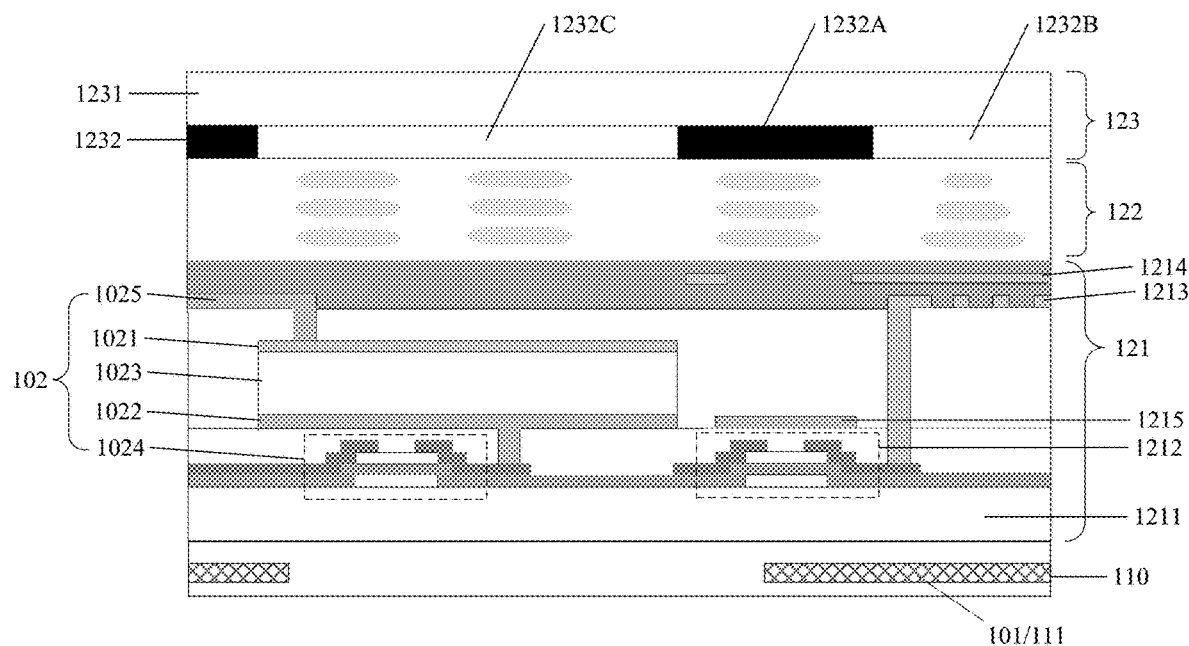
FIG. 5 is another schematic cross-sectional view of a liquid crystal display device provided by at least one embodiment of the present disclosure.

For example, FIG. 5 shows a schematic cross-sectional view of a sub-pixel unit of a liquid crystal panel. As illustrated in FIG. 5, each sub-pixel unit includes a first switch component 1212 to receive the scanning signal and the data signal, and each image sensor 102 includes a photosensitive component and a second switch component 1024. For example, the pixel array includes a first sub-pixel unit, the image sensor array includes a first image sensor, the first sub-pixel unit and the first image sensor are adjacent to each other, and the second switch component 1024 of the first image sensor is at least partially in the same layer as the first switch component 1212 of the first sub-pixel unit, so that the second switch component 1024 and the first switch component 1212 may be formed by a same material and by a same patterning process or by a same mask in the manufacture process. For example, the first switch component 1212 and the first switch component 1212 are components having a function of switch such as thin film transistors (TFT).

Figure 12A:
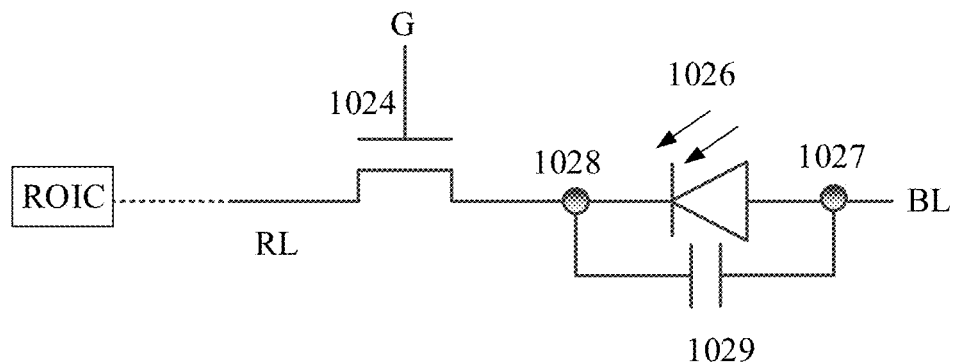
FIG. 12A is a schematic diagram of a structure and a connection relationship of an image sensor in a texture recognition device provided by at least one embodiment of the present disclosure.

The specific structure and operation process of the image sensor 102 are as follows. For example, FIG. 12A shows a structure and a circuit connection relationship of an exemplary image sensor. As illustrated in FIG. 12A, each image sensor 102 includes a photosensitive component 1026 and a second switch component 1024. In some examples, the image sensor 102 may also include a capacitor 1029. A first end (anode end) 1027 of the photosensitive component 1026 is connected to a bias line BL, a second end (cathode end) 1028 of the photosensitive component 1026 is connected to a first electrode of the second switch component 1024, a second electrode of the second switch component 1024 is connected to a signal readout line RL, a control electrode G of the second switch component 1024 is connected to the scanning signal for the image sensor array, and the signal readout line RL is connected to a readout integrated circuit ROIC. A first electrode of the capacitor 1029 is electrically connected to the first end 1027 of the photosensitive component 1026, and a second electrode of the capacitor 1029 is electrically connected to the second end 1028 of the photosensitive component 1026.

The operation process of the above exemplary image sensor including the capacitor 1029 includes the following steps: in a reset stage, the second switch component 1024 is turned on by inputting a scanning signal to the control electrode G, the ROIC writes a reset signal to the capacitor 1029 through the second switch component 1024 to reset the capacitor 1029, and also reset the photosensitive component 1026; in a photosensitive stage, the second switch component 1024 is turned off, the photosensitive component 1026 is in a negative bias state, the photosensitive component 1026 generates photo-generated carriers under the irradiation of reflected light and charges the capacitor 1029, so that the capacitor 1029 generates and stores an electrical signal; in a detection stage, the second switch component 1024 is turned on, and the ROIC reads the electrical signal stored by the capacitor 1029 through the second switch component 1024, and then a texture image is formed.

Figure 12B:
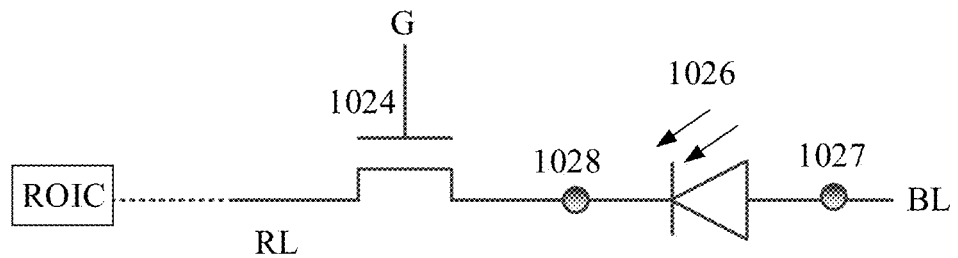
FIG. 12B is a schematic diagram of a structure and a connection relationship of another image sensor in the texture recognition device provided by at least one embodiment of the present disclosure.

FIG. 12B shows the structure and the circuit connection relationship of another exemplary image sensor, and this image sensor does not include a capacitor. The operation process of the exemplary image sensor without a capacitor includes the following steps: in a reset stage, the second switch component 1024 is turned on by inputting a scanning signal to the control electrode G, and ROIC writes a reset signal to the cathode of the photosensitive component 1026 through the second switch component 1024, so that the photosensitive component 1026 is reset; in a photosensitive stage, the second switch component 1024 is turned off, the photosensitive component 1026 is in a negative bias state, and the photosensitive component 1026 generates photo-generated carriers to generate a photo-generated leakage current under the irradiation of reflected light; in a detection stage, the second switch component 1024 is turned on, and the ROIC reads an electrical signal corresponding to the photo-generated leakage current through the second switch component 1024, and then a texture image is formed.

For example, in some embodiments, as illustrated in FIG. 5, layers of the second switch component 1024 of the first image sensor and layers with the same functions, as the layers of the second switch component 1024, of the first switch component 1212 of the first sub-pixel unit are respectively disposed in the same layers, so that the second switch component 1024 and the first switch component 1212 can be formed in a same process (e.g., patterning process) in the manufacture process.

For example, as illustrated in FIG. 5, the photosensitive component of the first image sensor may be a photodiode including a first electrode 1021, a second electrode 1022, and a semiconductor layer 1023 between the first electrode 1021 and the second electrode 1022. For example, the photodiode may be of a PN type or a PIN type, etc. In the case where the photodiode is of the PN type, the semiconductor layer 1023 includes a P-type semiconductor layer and an N-type semiconductor layer that are stacked; in the case where the photodiode is of the PIN type, the semiconductor layer 1023 includes a P-type semiconductor layer, an intrinsic semiconductor layer and an N-type semiconductor layer that are stacked. For example, the semiconductor material adopted by the semiconductor layer 1023 may include at least one selected from a group of silicon, germanium, selenium, gallium arsenide, etc., and no limitation is imposed to this in the embodiments of the present disclosure.

For example, the first sub-pixel unit includes a first pixel electrode 1213 electrically connected to the first switch component 1212, and the first sub-pixel unit further includes a first common electrode 1214, and first pixel electrode 1213 and the first common electrode 1214 are jointly used to drive the liquid crystal material in the liquid crystal layer 122, so as to control the liquid crystal material to deflect. For example, a material of the first pixel electrode 1213 and a material of the first common electrode 1214 are metal oxides such as ITO, IZO and the like, and the material of the first pixel electrode 1213 and the material of the first common electrode 1214 may be the same or different. For example, both the first pixel electrode 1213 and the first common electrode 1214 may be disposed on the array substrate (the case illustrated in FIG. 5), or may be respectively disposed on the array substrate and the opposite substrate, for example, the first pixel electrode 1213 is disposed on the array substrate, and the first common electrode 1214 is disposed on the opposite substrate, and no limitation is imposed to this in the embodiments of the present disclosure.

For example, the first pixel electrode 1213 of the first sub-pixel unit is disposed in a same layer as the first electrode 1021 included in the photosensitive component of the first image sensor. Thus, in the manufacture process of the liquid crystal panel, the first pixel electrode 1213 and the first electrode 1021 may be formed in a same process (e.g., patterning process). Alternatively, in some examples, the photosensitive component of the first image sensor further includes a lead line 1025 electrically connected to the first electrode 1021, and the lead line 1025 of the first electrode 1021 is disposed in a same layer as the first pixel electrode 1213. Thus, in the manufacture process of the liquid crystal panel, the first pixel electrode 1213 and the lead line 1025 of the first electrode 1021 can be formed in a same process (e.g., patterning process). In this embodiment, the above design can simplify the manufacture process of the liquid crystal panel.

For example, as illustrated in FIG. 5, in the liquid crystal panel, a light shielding layer 1215 in a same layer as the second electrode 1022 is provided on the first switch component 1212 of the sub-pixel unit, and the light shielding layer 1215 can prevent light from entering the first switch component 1212, so as to prevent the light from generating adverse effects on the performance of the first switch component 1212. In this case, in the manufacture process of the liquid crystal panel, the second electrode 1022 and the light shielding layer 1215 may be formed in a same process (e.g., patterning process), thereby simplifying the manufacture process of the liquid crystal panel.

For example, as illustrated in FIG. 5, the array substrate 121 further includes a base substrate 1211, and an orthographic projection of the photosensitive component of the first image sensor on the base substrate 1211 at least partially overlaps with, for example, completely overlaps with, an orthographic projection of the second switch component 1024 of the first image sensor on the base substrate 1211. For example, as illustrated in FIG. 5, the orthographic projection of the second switch component 1024 on the base substrate 1211 is within the orthographic projection of the photosensitive component of the first image sensor on the base substrate 1211.

For example, in some examples, the orthographic projection of the photosensitive component of the first image sensor on the base substrate 1211 further at least partially overlaps with, for example, completely overlaps with, an orthographic projection of the first switch component 1212 of the first sub-pixel unit on the base substrate 1211. For example, the orthographic projection of the first switch component 1212 on the base substrate 1211 is within the orthographic projection of the photosensitive component of the first image sensor on the base substrate 1211. In this case, a photosensitive area of the photosensitive component of the first image sensor is larger, which is beneficial to forming a larger texture image.

Figure 7A:
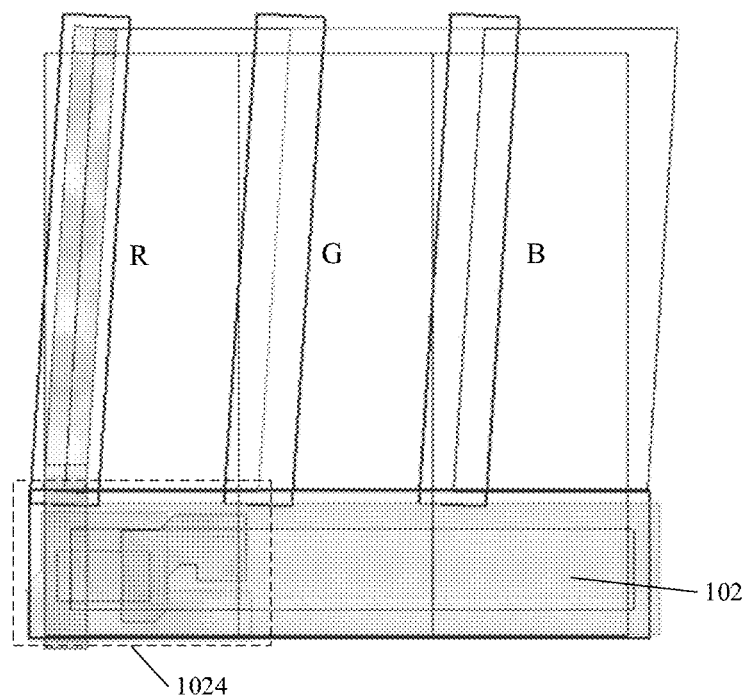
FIG. 7A is a schematic diagram showing an arrangement of pixel units and image sensors in a liquid crystal display device provided by at least one embodiment of the present disclosure.

For example, in the example illustrated in FIG. 7A, one image sensor is provided corresponding to one pixel unit, and the image sensor and the first switch component of the sub-pixel unit are provided on a same side of the pixel unit. In this case, the photosensitive component of the image sensor may cover the first switch components (not illustrated) of the three sub-pixel units included in the one pixel unit and cover the second switch component of the image sensor, i.e. orthographic projections of the first switch components of the three sub-pixel units included in the one pixel unit on the base substrate 1211 and the orthographic projection of the second switch component of the image sensor on the base substrate 1211 are all within the orthographic projection of the photosensitive component of the image sensor on the base substrate 1211, and in this case, the photosensitive component of the image sensor has a larger photosensitive area, which is beneficial to forming a larger texture image.

Figure 7B:
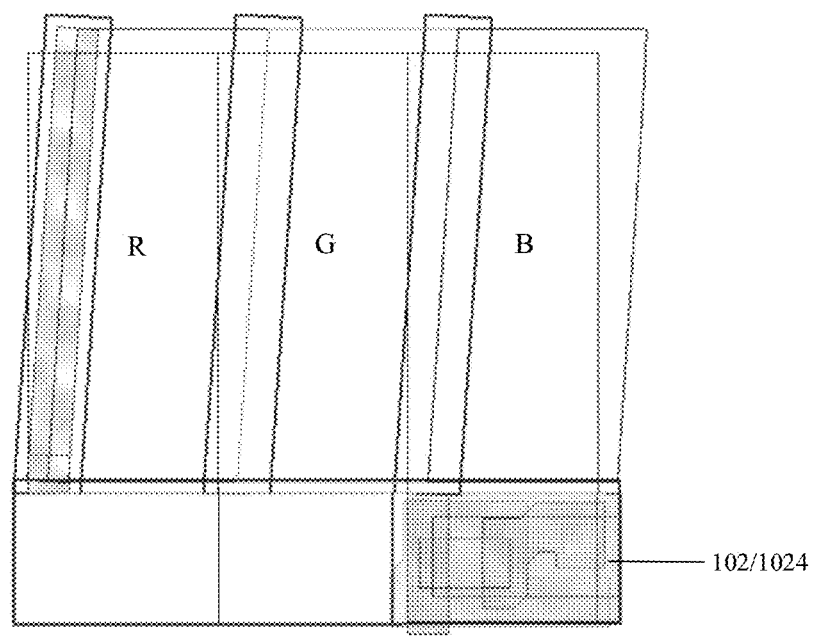
FIG. 7B is a schematic diagram showing another arrangement of pixel units and image sensors in a liquid crystal display device provided by at least one embodiment of the present disclosure.

For example, in the example illustrated in FIG. 7B, one image sensor is provided corresponding to one pixel unit, and the image sensor is adjacent to the blue sub-pixel unit B, in this case, the photosensitive component of the image sensor may cover the first switch component (not illustrated in the figure) of the blue sub-pixel unit included in the one pixel unit and cover the second switch component of the image sensor. That is, an orthographic projection of the first switch component of the blue sub-pixel unit on the base substrate 1211 and the orthographic projection of the second switch component of the image sensor on the base substrate 1211 are both within the orthographic projection of the photosensitive component of the image sensor on the base substrate 1211, and in this case, the arrangement of the image sensor has the least influence on the display effect of the liquid crystal display device.

Figure 7C:
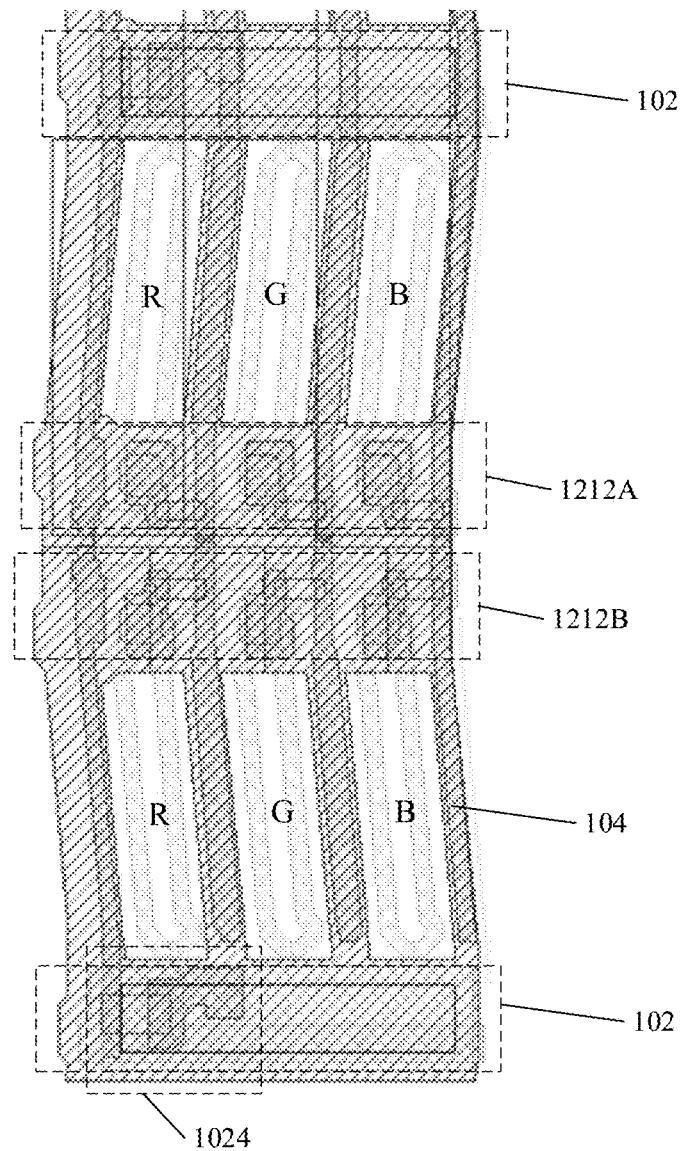
FIG. 7C is a schematic diagram showing further another arrangement of pixel units and image sensors in a liquid crystal display device provided by at least one embodiment of the present disclosure.

For example, as illustrated in FIG. 7C, in some examples, the first switch component of the sub-pixel unit and the image sensor are respectively disposed on different sides of the sub-pixel unit. For example, as illustrated in FIG. 7, two rows of first switch components 1212A and 1212B are provided between two adjacent rows of pixel units respectively for driving sub-pixel units in the two rows of pixel units. For example, three first switch components included in the first row of first switch components 1212A are respectively used to drive the three sub-pixel units included in the pixel unit of the previous row in the figure, and three first switch components included in the second row of first switch components 1212B are respectively used to drive the three sub-pixel units included in the pixel unit of the next row in the figure.

For example, in the example illustrated in FIG. 7C, the image sensor corresponding to the previous row of pixel units is disposed on an upper side of the previous row of pixel units, and the image sensor corresponding to the next row of pixel units is disposed on a lower side of the next row of pixel units. For example, one image sensor may be provided corresponding to one pixel unit, and in this case, two rows of image sensors are provided between two adjacent rows of pixel units. Alternatively, one image sensor may be provided corresponding to two pixel units, and in this case, one row of image sensors are provided between two adjacent rows of pixel units. The embodiments of the present disclosure do not limit the corresponding mode of the pixel unit and the image sensor. Compared with the arrangement that the image sensor 102 and the first switch component are on the same side of the pixel unit, the above design can prevent the device arrangement from being too compact, or can prevent the space between adjacent pixel units from being too large because of the arrangement of too many devices.

For example, in some embodiments, the liquid crystal display device further includes a touch structure configured to perform a touch operation on the liquid crystal display device, and may further be configured to acquire the touch position and the touch area of the texture on the touch side 112. The touch structure includes a plurality of touch electrodes, for example, the touch structure is implemented as a self-capacitance type touch structure or a mutual-capacitance type touch structure. For example, the first common electrode 1214 in the liquid crystal panel also serves as a touch electrode, i.e., the first common electrode 1214 is used to apply a common voltage during display and is used as a touch electrode during touch to generate a touch signal.

Figure 13A:
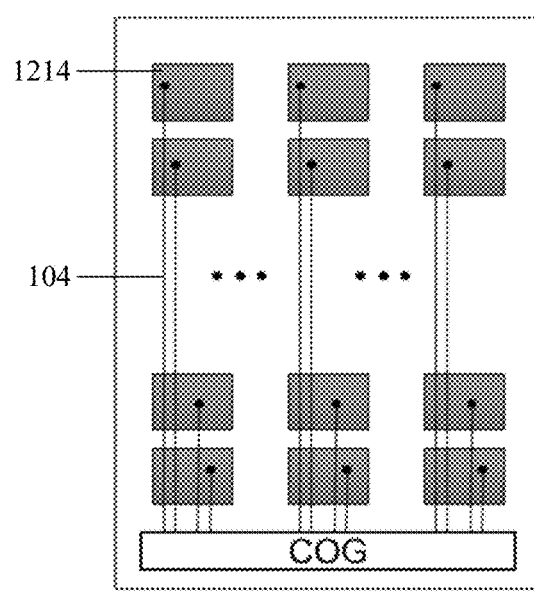
FIG. 13A is a schematic diagram of a touch structure in a texture recognition device provided by at least one embodiment of the present disclosure.

FIG. 13A shows a schematic planar view of the first common electrode 1214. As illustrated in FIG. 13A, the first common electrodes 1214 in block shapes are arranged in an array and also serve as the touch electrodes, each of the touch electrodes is connected to one touch lead line 104, and the touch lead line 104 is connected to a chip (e.g., COG, Chip on Glass). For example, the touch structure is a self-capacitance touch structure.

Figure 13B:
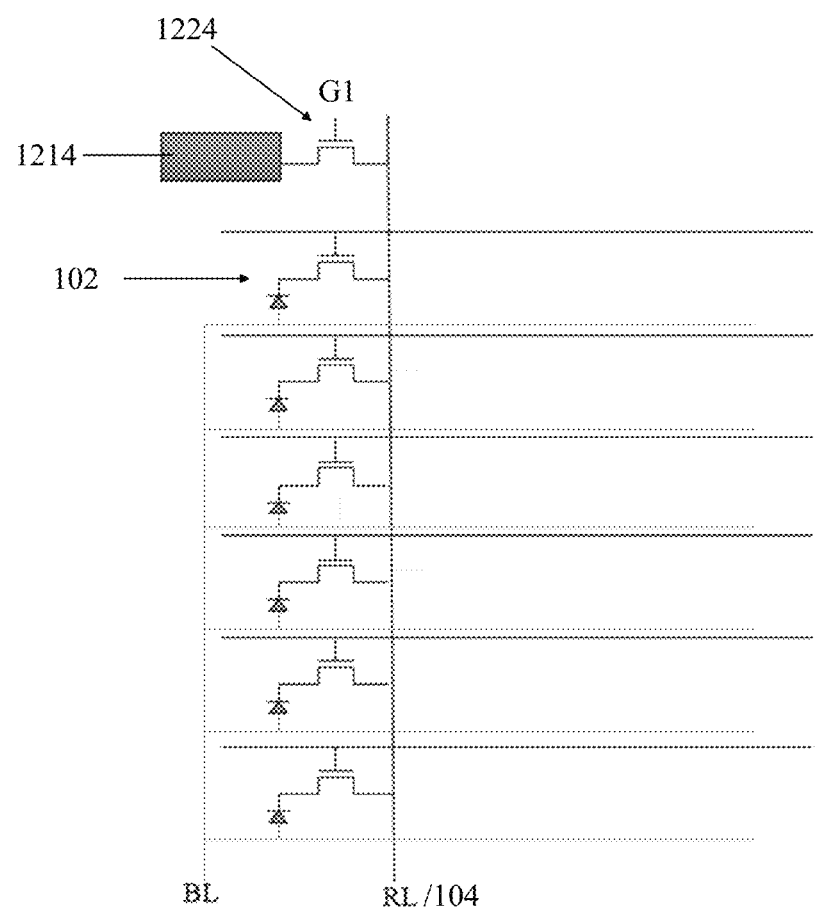
FIG. 13B is a circuit diagram of an image sensor in a texture recognition device provided by at least one embodiment of the present disclosure.

For example, in some embodiments, the signal readout line RL electrically connected to the second switch component of the image sensor also serves as the touch lead line 104, i.e., the touch lead line 104 is simultaneously used as the signal readout line RL. For example, as illustrated in FIG. 13B, the signal readout line RL is connected to a plurality of image sensors 102, and the first common electrode 1214 (touch electrode) is electrically connected to the signal readout line RL (touch lead line 104) through a third switch component (e.g., thin film transistor) 1224. During a touch operation, the third switch component 1224 is controlled to be turned on by the first common electrode 1214 and a control terminal G1 of the third switch component 1224, so as to perform the touch operation; during performing the texture collection, the third switch component 1224 is controlled to be turned off by the first common electrode 1214 and the control terminal G1 of the third switch component 1224, so as to perform the texture collection. For example, referring to FIG. 7C, the touch lead line 104 may be arranged along edges of the pixel units.

For example, in some embodiments, the touch lead line 104 and the signal readout line RL for texture recognition are stacked and are spaced apart from each other by an insulation layer. In this case, an orthographic projection of the touch lead line 104 on the base substrate 1211 at least partially overlaps with an orthographic projection of the signal readout line RL on the base substrate 1211, so as to simplify the arrangement of the touch lead line 104 and the signal readout line RL. Compared with the case where the touch lead line 104 also serves as the signal readout line RL, in the above design, the third switch component may not be provided, thus saving the arrangement space.

For example, in some embodiments, as illustrated in FIG. 5, the opposite substrate 123 of the liquid crystal panel includes a second base substrate 1231 and a black matrix layer 1232 on a side of the second base substrate 1231 close to the liquid crystal layer 122. The black matrix layer 1232 includes a black matrix setting region 1232A, a plurality of first black matrix regions 1232B (e.g., first black matrix openings) exposing a plurality of sub-pixel units, and a plurality of second black matrix regions 1232C (e.g., second black matrix openings) exposing a plurality of image sensors 102. For example, the black matrix setting region 1232A corresponds to an interval region of adjacent sub-pixel units to play a light shielding role and prevent light mixing between the adjacent sub-pixel units.

For example, a first light filter pattern is provided in the first black matrix region 1232B, and the first light filter pattern is used to form monochromatic light. For example, the first light filter pattern in the red sub-pixel unit is a red filter pattern, so that light transmitted through the red sub-pixel unit is red light; the first light filter pattern in the green sub-pixel unit is a green filter pattern, so that light transmitted through the green sub-pixel unit is green light; and the first light filter pattern in the blue sub-pixel unit is a blue filter pattern, so that light transmitted through the blue sub-pixel unit is blue light.

For example, a second light filter pattern is provided in the second black matrix region 1232C, and the second light filter pattern can filter the light emitted from the light source array and then reflected to the image sensor array by the texture.

Because in the fingerprint recognition process, besides the light emitted by the light source array can be sensed by the image sensor array, the image sensor array may also sense ambient light incident through the finger. Because the image sensor receives light passively and cannot actively distinguish the light emitted by the light source array from the ambient light, the ambient light may interfere with fingerprint recognition of the image sensor. For example, when the ambient light is directly incident right above the finger, the ambient light can pass through the finger and excite biological tissues in the finger to emit pigment light, and the pigment light may interfere with fingerprint recognition. By a detection, the pigment light mainly includes light with a wavelength of more than 600 nm. In this case, the second light filter pattern can filter the undesired light.

For example, the second light filter pattern can absorb light with a wavelength range of 600 nm to 900 nm, and therefore the second light filter pattern can absorb the above-mentioned ambient light/pigment light, so as to prevent the ambient light/pigment light from being emitted to the image sensor array to cause interference to image collection. For example, the image sensor adopted in this embodiment does not respond to infrared light with a wavelength range of more than 900 nm, so interference of the ambient light/pigment light on the image sensor can be further avoided.

For example, the second light filter pattern may be formed of an organic resin material, and a colored dye may be doped into the organic resin material to form a certain filtering effect on light with a wavelength range of 600 nm to 900 nm. The colored dye includes, for example, bromamine acid derivatives and the like. For example, the second light filter pattern may also include an inorganic material, and specifically, the second light filter pattern may be formed by alternately stacking inorganic layers of titanium oxide ($Ti_3O_5$) with a high refractive index and silicon dioxide ($SiO_2$) with a low refractive index. The embodiments of the present disclosure do not limit the specific material of the second light filter pattern.

It should be noted that the liquid crystal panel may include structures such as polarizers, etc. in addition to the pixel unit array. For example, the array substrate is provided with a first polarizer and the opposite substrate is provided with a second polarizer, and the polarization direction of the first polarizer and the polarization direction of the second polarizer are perpendicular to each other. Liquid crystal molecules of the liquid crystal layer are deflected under the drive of an electric field, and the transmittance of light is controlled under the cooperation of the first polarizer and the second polarizer, thereby realizing gray scale display. For example, the liquid crystal panel further includes a driving circuit configured to drive each pixel unit, and signal lines (including gate lines, data lines, detection lines, etc.) configured to supply electrical signals (including the scanning signal, the data signal, a detection signal, etc.), and a driving circuit connected to the image sensor 102, etc. The embodiments of the present disclosure do not specifically limit other structures of the liquid crystal panel.

In the process of the texture collection performed by the texture recognition device 100, the imaging range formed by one photosensitive light source is usually limited. In the case where the area of the texture is large, the imaging range formed by one photosensitive light source may not be sufficient to meet the demand of the texture recognition. In this case, a method of lighting a plurality of photosensitive light sources in a time-sharing manner can be adopted to form a plurality of effective imaging ranges, and the effective imaging ranges are superposed and spliced to obtain a larger texture image.

For example, in some embodiments, during the texture collection process of the texture recognition device 100, as illustrated in FIG. 3B, the light valve structure 120 is further configured to control a second region 2 different from the first region 1 to be in a light transmission state, so as to allow the light emitted from the light source array to pass through the second region 2 in the light transmission state to form a second photosensitive light source 202. Furthermore, the light valve structure 120 is configured to allow the first region 1 and the second region 2 to be in the light transmission state at different time, for example, the first region 1 is in the light transmission state at the first time and the second region 2 is in the light transmission state at the second time different from the first time.

Figure 8A:
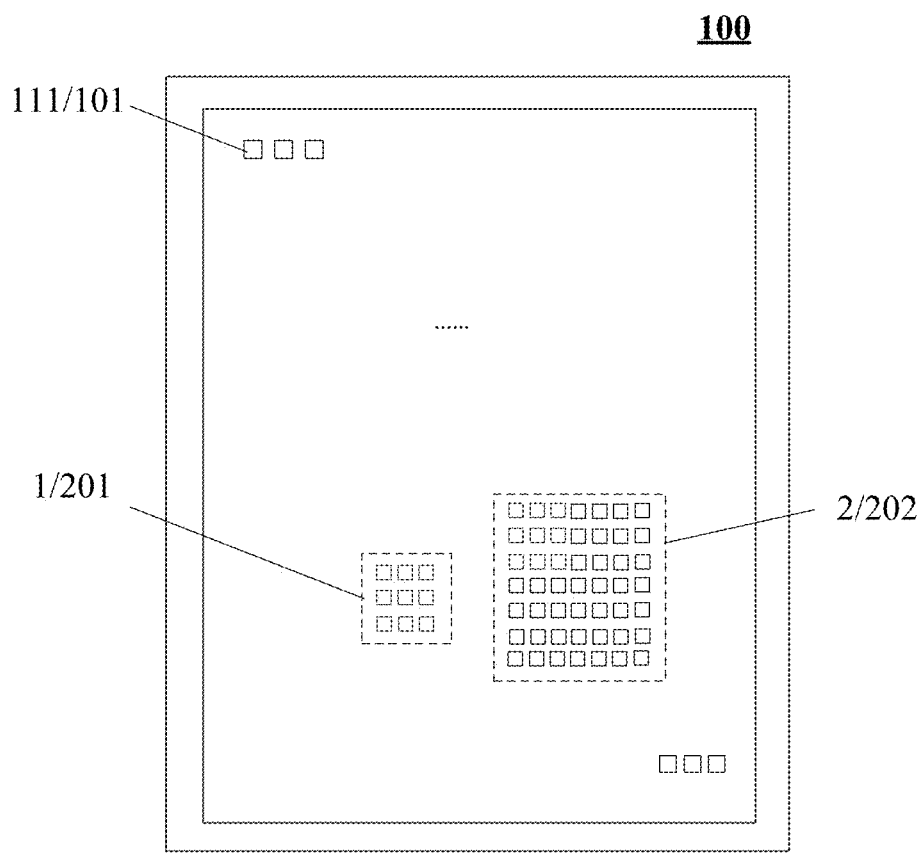
FIG. 8A is a schematic diagram of a photosensitive light source formed by a liquid crystal display device provided by at least one embodiment of the present disclosure.

For example, in some examples, as illustrated in FIG. 8A, the size of the second region 2 is larger than the size of the first region 1. For example, in the case where the texture recognition device 100 is a liquid crystal display device, the number of the pixel units (or sub-pixel units) corresponding to the second region 2 is larger than the number of the pixel units (or sub-pixel units) corresponding to the first region 1. For example, each of the first photosensitive light source 201 and the second photosensitive light source 202 corresponds to a plurality of pixel units arranged continuously to form a point photosensitive light source. For example, the first photosensitive light source 201 corresponds to 2×2 pixel units or 3×3 pixel units which are arranged in an array, and the second photosensitive light source 202 corresponds to 7×7 pixel units or 8×8 pixel units which are arranged in an array, and therefore the first photosensitive light source 201 is formed as a small point light source and the second photosensitive light source is formed as a large point light source.

Figure 8B:
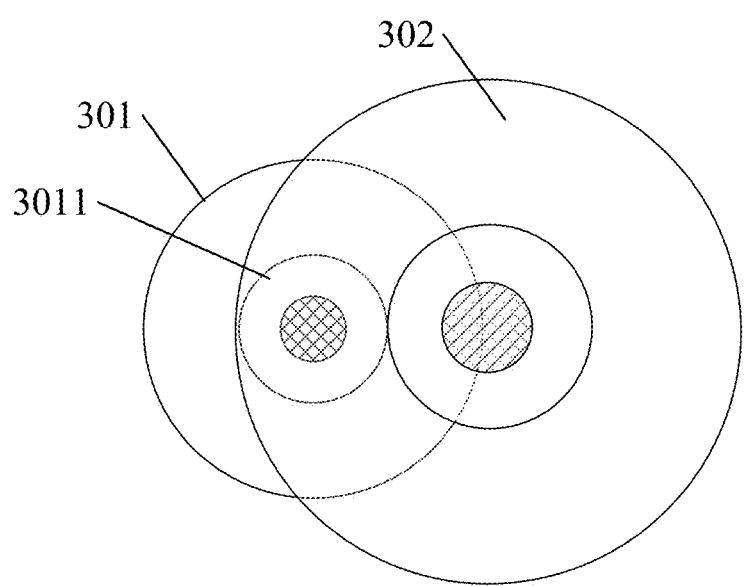
FIG. 8B is a schematic diagram of an imaging range of the photosensitive light source in FIG. 8A.

As illustrated in FIG. 8B, a first imaging range of the first photosensitive light source 201 on the image sensor array is in a first ring shape 301, a second imaging range of the second photosensitive light source 202 on the image sensor array is in a second ring shape 302, and the second ring shape 302 at least partially covers (illustrated as completely covering) a ring center part 3011 of the first ring shape 301. Because the ring center part 3011 is the invalid imaging region of the first photosensitive light source 201, the imaging range of the second photosensitive light source 202 can supplement the invalid imaging region, so that the effective imaging range of the first photosensitive light source 201 and the effective imaging range of the second photosensitive light source 202 are superimposed and spliced to obtain a larger imaging range.

Figure 9A:
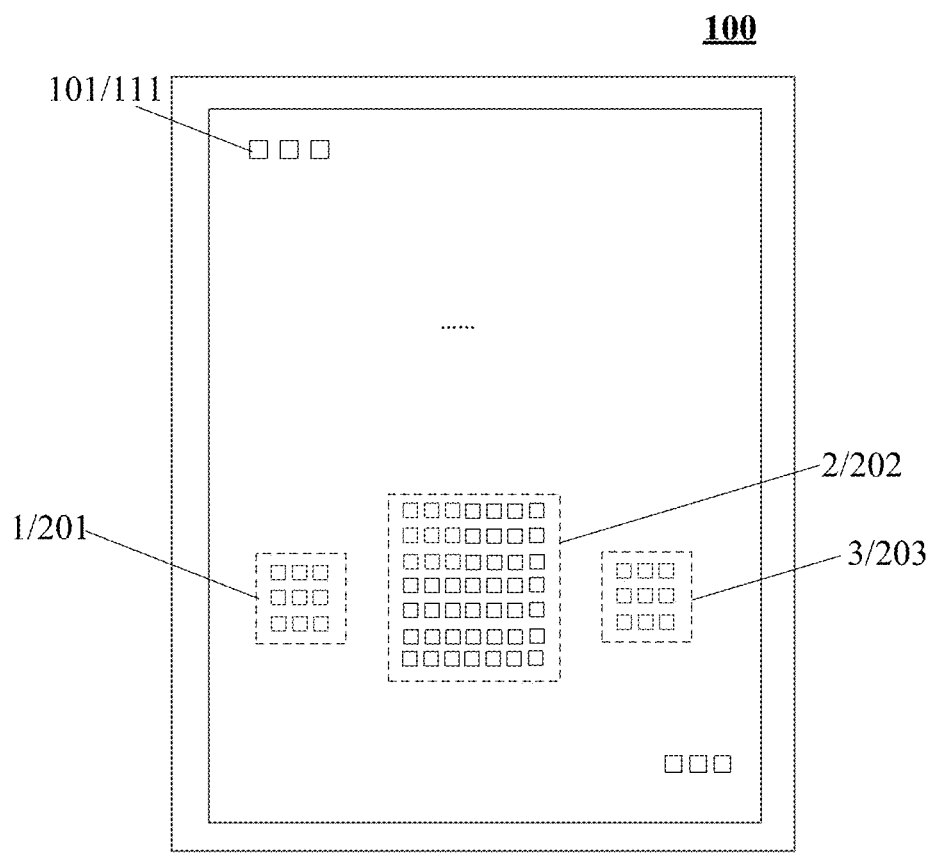
FIG. 9A is another schematic diagram of a photosensitive light source formed by a liquid crystal display device provided by at least one embodiment of the present disclosure.

For example, in some examples, as illustrated in FIG. 9A, in order to further enlarge the imaging range, the light valve structure 120 is further configured to control a third region 3 different from both of the first region 1 and the second region 2 to be in the light transmission state to allow the light emitted from the light source array to pass through the third region 3 in the light transmission state to form a third photosensitive light source 203. Moreover, the light valve structure 120 is further configured to allow the first region 1 and the third region 3 to be in the light transmission state at the same time, for example, both of the first region 1 and the third region 3 are in the light transmission state at the first time, and the second region 2 is in the light transmission state at the second time different from the first time.

Figure 9B:
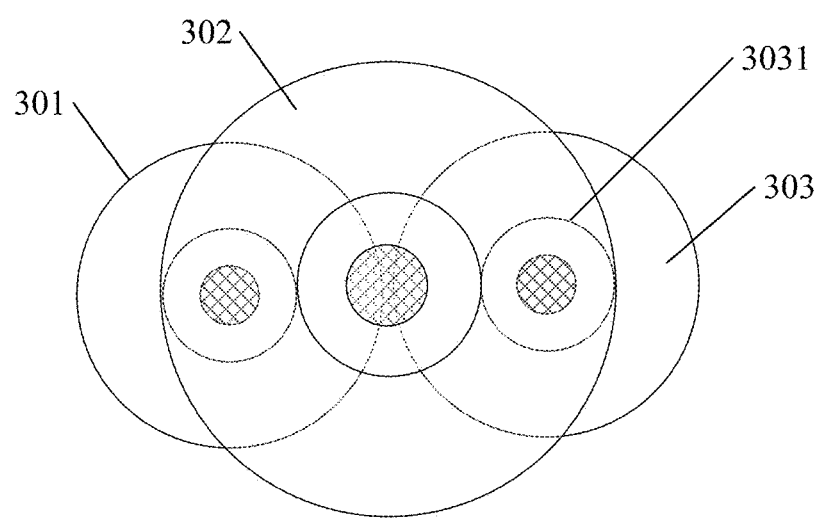
FIG. 9B is a schematic diagram of an imaging range of the photosensitive light source in FIG. 9A.

For example, a size of the third region 3 is equal to the size of the first region 1. For example, in the case where the texture recognition device is a liquid crystal display device, the number of pixel units (or sub-pixel units) corresponding to the third region 3 is the same as the number of pixel units (or sub-pixel units) corresponding to the first region 1. As illustrated in FIG. 9B, a third imaging range of the third photosensitive light source 203 on the image sensor array is in a third ring shape 303, and the second ring shape 302 further at least partially covers a ring center part 3031 of the third ring shape 303. Because the ring center part 3031 is the invalid imaging region of the third photosensitive light source 203, the imaging range of the second photosensitive light source 202 can supplement the invalid imaging region, so that the effective imaging ranges respectively of the first photosensitive light source 201, the second photosensitive light source 202 and the third photosensitive light source 203 are superimposed and spliced to obtain a larger imaging range.

Figure 10A:
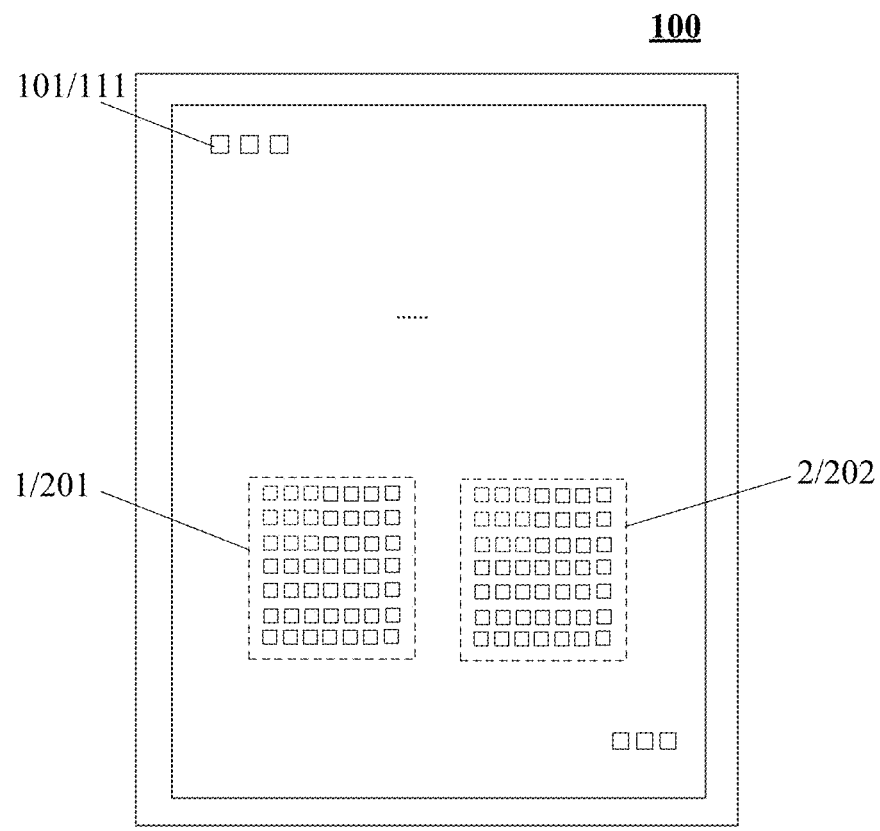
FIG. 10A is further another schematic diagram of a photosensitive light source formed by a liquid crystal display device provided by at least one embodiment of the present disclosure.

For example, in other examples, as illustrated in FIG. 10A, in the case where the light valve structure 120 is configured to allow the first region 1 and the second region 2 to be in the light transmission state at different time, for example, the first region 1 is in the light transmission state at the first time and the second region 2 is in the light transmission state at the second time different from the first time, the size of the second region 2 may be equal to the size of the first region 1. For example, in the case where the texture recognition device is a liquid crystal display device, the number of pixel units (or sub-pixel units) corresponding to the second region 2 is the same as the number of pixel units (or sub-pixel units) corresponding to the first region 1, for example, each of the second region 2 and the first region 1 corresponds to 7×7 pixel units arranged in an array or 8×8 pixel units arranged in an array, thereby both the first photosensitive light source 201 and the second photosensitive light source are formed as large point light sources.

Figure 10B:
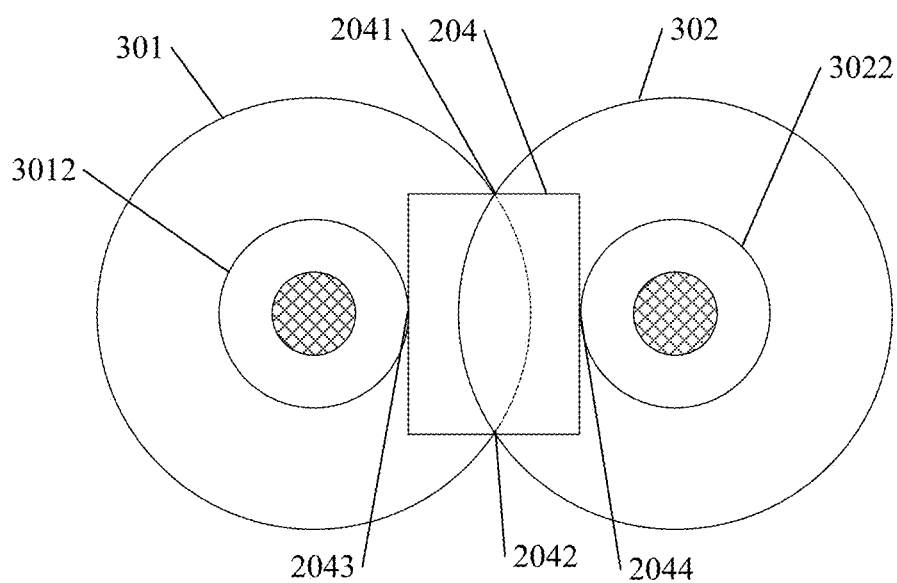
FIG. 10B is a schematic diagram of an imaging range of the photosensitive light source in FIG. 10A.

In this case, as illustrated in FIG. 10B, the first imaging range of the first photosensitive light source 201 on the image sensor array is in the first ring shape 301, the second imaging range of the second photosensitive light source 202 on the image sensor array is in the second ring shape 302, and the first ring shape 301 has only two intersection points with the second ring shape 302. Two closest points respectively on an inner circle 3012 of the first ring shape 301 and an inner circle 3022 of the second ring shape 302 are a first point 2043 and a second point 2044, and an imaging range in a rectangle shape formed by four sides is used for imaging the texture, taking the two intersection points 2041 and 2042, the first point 2043 and the second point 2044 as midpoints of the four sides respectively.

For example, in the process that the first ring shape 301 and the second ring shape 302 approach each other, a distance between the two intersection points 2041 and 2042 of the first ring shape 301 and the second ring shape 302 becomes larger and larger while a distance between the first point 2043 and the second point 2044 becomes smaller and smaller, and therefore the size of the rectangular imaging range 204 has a maximum value. For example, the extent to which the first ring shape 301 and the second ring shape 302 overlap maximizes the size of the rectangular imaging range 204, thereby a larger texture image can be obtained.

Figure 10C:
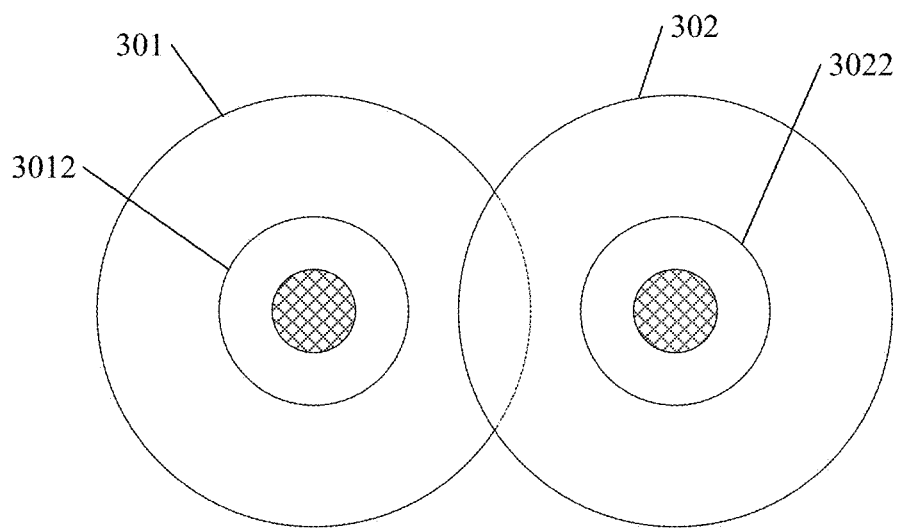
FIG. 10C is a schematic diagram of another imaging range of the photosensitive light source in FIG. 10A.

For example, in other examples, as illustrated in FIG. 10C, an imaging range formed in a range covered by either of the first ring shape 301 and the second ring shape 302 is used for imaging the texture. Thus, an imaging range that has a larger size and is in a shape close to a shape of "8" can be obtained.

Figure 11:
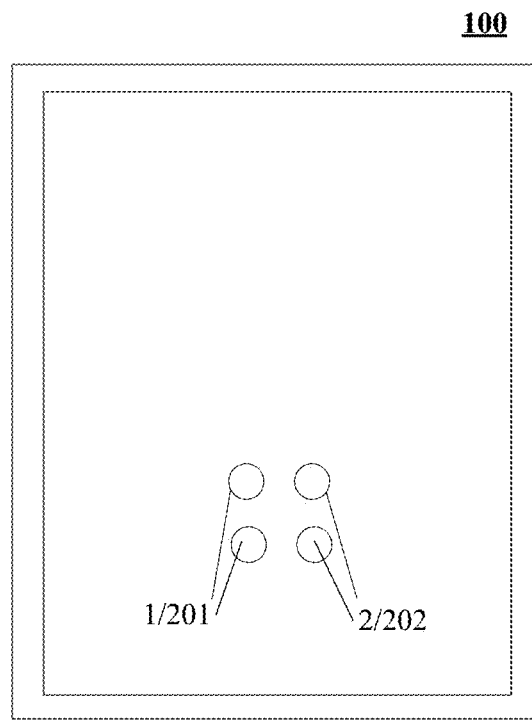
FIG. 11 is a schematic diagram of photosensitive light sources arranged in an array formed by a texture recognition device provided by at least one embodiment of the present disclosure.

For example, in some embodiments, in the case where the size of the texture is large, as illustrated in FIG. 11, the light valve structure 120 may also be configured to allow a plurality of first regions 1 arranged in an array to transmit light at the first time to form a plurality of the first photosensitive light sources 201 (two illustrated in the figure) arranged in an array, and to allow a plurality of second regions 2 arranged in an array to transmit light at the second time to form a plurality of second photosensitive light sources 202 (two illustrated in the figure) arranged in an array, so that the imaging ranges of the photosensitive light sources may be superimposed and spliced to form a larger imaging range. For example, in other embodiments, according to situations, more first photosensitive light sources 201 and more second photosensitive light sources 202 may be provided, and a plurality of third photosensitive light sources 303 may also be provided, which is not limited in the embodiments of the present disclosure.

For example, the controller 103 detects a contact area between the texture and the touch side through the touch structure, and when the contact area is larger than a threshold area, the light valve structure 120 performs the above operation. For example, the threshold area may be set according to the operator (e.g., finger) providing the texture, e.g., the threshold area may be set to 1 cm×1 cm, etc., which is not limited in the embodiments of the present disclosure. Therefore, the texture recognition device 100 can selectively provide a photosensitive light source according to the contact area of the texture, so as to obtain a texture image of a corresponding size, which facilitates the texture recognition.

It should be noted that the above embodiments are described by taking the case where a point light source is taken as the photosensitive light source as an example. In other embodiments, the photosensitive light source may also be a line light source or other patterned light sources, and the embodiments of the present disclosure are not specifically limited in this aspect. In addition, the point photosensitive light source can be obtained by adjusting the shape of the light transmission region (the first region 1, the second region 2, etc.), for example, the light transmission region may be in an approximately square shape, in an approximately circular shape, and in some cases, the light transmission region may also be formed into an irregular pattern, which is not specifically limited in the embodiments of the present disclosure.

In addition, in the embodiments of the present disclosure, the controller 103 may be various types of controllers, such as various types of integrated circuit chips with processing functions, which have various computing architectures, such as a complex instruction set computer (CISC) architecture, a reduced instruction set computer (RISC) architecture, or a structure that implements various instruction set combinations. In some embodiments, the controller 230 may be a microprocessor, such as an X86 processor or an ARM processor, or may be a digital processor (DSP) or the like. The embodiments of the present disclosure do not limit the type of the controller 103.

For example, in some embodiments, the controller 103 may further include a memory, and the memory is configured to store a control program for forming the light transmission region by time sharing, a control program for forming a plurality of light transmission regions by time sharing, and the like. For example, the memory may be any form of storage medium, such as a volatile memory or a nonvolatile memory, a semiconductor memory or a magnetic medium memory, and so on, and no limitation is imposed to this in the embodiments of the present disclosure.

At least one embodiment of the present disclosure further provides a driving method of a texture recognition device, the texture recognition device is any one of the above-mentioned texture recognition devices. The texture recognition device has a touch side and comprises a light source array, an image sensor array and a light valve structure; the image sensor array is configured to receive light emitted from the light source array and then reflected to the image sensor array by a texture for a texture collection; the light valve structure is on a side of the light source array close to the touch side. The driving method comprises: controlling a first region of the light valve structure to be in a light transmission state according to a control signal, so as to allow light emitted from the light source array to pass through the first region in the light transmission state to form a first photosensitive light source. The first photosensitive light source forms a first imaging range on the image sensor array, and the first imaging range is used for imaging the texture to obtain a first texture image. The image sensor array operates to collect data corresponding to the first texture image, and sends the collected data corresponding to the first texture image to a controller or a processor for further processing to obtain the first texture image.

For example, in some embodiments, the driving method further includes: controlling a second region to be in a light transmission state according to a control signal, so as to allow the light emitted from the light source array to pass through the second region in the light transmission state to form a second photosensitive light source. For example, the second region is different from the first region, and the first region and the second region are in the light transmission state at different time. The second photosensitive light source forms a second imaging range of on the image sensor array, so as to obtain a second texture image, and both the second imaging range and the first imaging range are used for imaging the texture. The image sensor array operates to collect data corresponding to the second texture image, and sends the collected data corresponding to the second texture image to the controller or the processor for further processing to obtain the second texture image. For example, the first texture image and the second texture image can be spliced and combined to obtain a more complete texture image.

For example, in some embodiments, the driving method further includes: controlling a third region different from both of the first region and the second region to be in the light transmission state to allow the light emitted from the light source array to pass through the third region in the light transmission state to form a third photosensitive light source. The method and the rule for providing the photosensitive light source may be referred to the above embodiments and are not repeated here.

For example, in some embodiments, the texture recognition device is implemented as a liquid crystal display device, in this case, the light valve structure is a liquid crystal light valve, the liquid crystal panel includes an array substrate, an opposite substrate, and a liquid crystal layer between the array substrate and the opposite substrate, the liquid crystal panel includes a pixel array, the pixel array includes a plurality of pixel units, each of the pixel units includes at least one sub-pixel unit, and the control signal includes a scanning signal and a data signal. For example, the driving method includes: controlling the light transmission state in a pixel region corresponding to at least one sub-pixel unit according to the scanning signal and the data signal.

For example, in the case where the texture recognition device is implemented as the liquid crystal display device, the liquid crystal display device may further includes a backlight, the backlight is a direct backlight, and includes a plurality of sub-light sources 111 arranged in an array, For example, the direct backlight can be controlled by the local dimming (LD) technology. In this case, the driving method may include: controlling the backlight to light one or more sub-light sources at corresponding positions of the first region (and/or the second region and the third region) as required, thereby realizing one or more photosensitive light sources for the texture recognition in combination with the light valve structure, for realizing the texture recognition, while sub-light sources at other positions remain off, thereby reducing the energy consumption of the texture recognition device.

For example, the driving method may further include: determining the position of the first region according to the touch position of the texture on the touch side, and controlling the light valve structure to provide the first photosensitive light source.

In another example, the driving method may further include: after determining the position of the first region, controlling the backlight to light one or more sub-light sources at corresponding positions of the first region, and controlling the light valve structure to provide the first photosensitive light source.

In addition, in some embodiments, the driving method may further include: acquiring the touch area of the texture on the touch side to determine the size and the number of the first region.

More driving methods of the texture recognition device may be referred to the above-mentioned embodiments and are not be repeated here.

The following should be noted:

(1) The accompanying drawings involve only the structure(s) in connection with the embodiment(s) of the present disclosure, and other structure(s) can be referred to common design(s).

(2) For clarity, in accompanying drawings for illustrating the embodiment(s) of the present disclosure, the thickness of a layer or a structure may be enlarged or reduced. However, it should understood that, in the case in which a component such as a layer, film, region, substrate or the like is referred to be "on" or "under" another component, it may be directly on or under the another component or a component is interposed therebetween.

(3) In case of no conflict, embodiments of the present disclosure and the features in the embodiments may be mutually combined to obtain new embodiments.

What have been described above are only specific implementations of the present disclosure, the protection scope of the present disclosure is not limited thereto. The protection scope of the present disclosure should be based on the protection scope of the claims.

What is claimed is:

1. A texture recognition device, having a touch side, and comprising:
a light source array;
an image sensor array configured to receive light emitted from the light source array and then reflected to the image sensor array by a texture for a texture collection; and
a light valve structure which is on a side, close to the touch side, of the light source array and is configured to control a first region to be in a light transmission state in response to a control signal, so as to allow light emitted from the light source array to pass through the first region in the light transmission state to form a first photosensitive light source;
wherein the light valve structure is further configured to control a second region different from the first region to be in a light transmission state to allow light emitted from the light source array to pass through the second region in the light transmission state to form a second photosensitive light source, and is configured to allow the first region and the second region to be in the light transmission state at different time.

2. The texture recognition device according to claim 1, wherein the light valve structure comprises a liquid crystal panel,
the liquid crystal panel comprises an array substrate, an opposite substrate, and a liquid crystal layer between the array substrate and the opposite substrate, the liquid crystal panel comprises a pixel array, the pixel array comprises a plurality of pixel units, the control signal comprises a scanning signal and a data signal, each of the pixel units comprises at least one sub-pixel unit, and each sub-pixel unit is configured to control a light transmission state in a pixel region corresponding to the sub-pixel unit according to the scanning signal and the data signal.

3. The texture recognition device according to claim 2, wherein the image sensor array comprises a plurality of image sensors, and the plurality of image sensors are in the array substrate of the liquid crystal panel;
each of the plurality of image sensors is between two adjacent rows of the pixel units, or each of the plurality of image sensors is in the pixel units; or
each of the plurality of image sensors is between adjacent sub-pixel units, or each of the plurality of image sensors is in the sub-pixel units.

4. The texture recognition device according to claim 3, wherein each of the pixel units comprises a red sub-pixel unit, a green sub-pixel unit, and a blue sub-pixel unit, and each of the image sensors is between blue sub-pixel units respectively of adjacent pixel units.

5. The texture recognition device according to claim 3, wherein each of the sub-pixel units comprises a first switch component to receive the scanning signal and the data signal, and each of the image sensors comprises a photosensitive component and a second switch component;
the pixel array comprises a first sub-pixel unit, the image sensor array comprises a first image sensor, the first sub-pixel unit and the first image sensor are adjacent to each other, and the second switch component of the first image sensor is at least partially in a same layer as the first switch component of the first sub-pixel unit.

6. The texture recognition device according to claim 5, wherein the photosensitive component of the first image sensor comprises a first electrode and a lead line electrically connected to the first electrode, the first sub-pixel unit comprises a first pixel electrode electrically connected to the first switch component;
the first electrode is in a same layer as the first pixel electrode, or
the lead line electrically connected to the first electrode is in a same layer as the first pixel electrode.

7. The texture recognition device according to claim 6, wherein the array substrate further comprises a base substrate, and an orthographic projection of the photosensitive component of the first image sensor on the base substrate at least partially overlaps with an orthographic projection of the second switch component of the first image sensor on the base substrate.

8. The texture recognition device according to claim 7, wherein the orthographic projection of the photosensitive component of the first image sensor on the base substrate further at least partially overlaps with an orthographic projection of the first switch component of the first sub-pixel unit on the base substrate.

9. The texture recognition device according to claim 6, further comprising a touch structure, wherein the touch structure comprises a touch electrode, the first sub-pixel unit further comprises a first common electrode, and
the first common electrode also serves as the touch electrode.

10. The texture recognition device according to claim 9, wherein the first image sensor further comprises a signal readout line electrically connected to the second switch component, the touch structure further comprises a touch lead line electrically connected to the touch electrode;
the signal readout line also serves as the touch lead line, or
an orthographic projection of the signal readout line on the base substrate at least partially overlaps with an orthographic projection of the touch lead line on the base substrate.

11. The texture recognition device according to claim 10, wherein where the signal readout line also serves as the touch lead line, the touch structure further comprises a third switch component, and the touch electrode is electrically connected to the touch lead line through the third switch component.

12. The texture recognition device according to claim 1, wherein a size of the second region is equal to a size of the first region,
a first imaging range of the first photosensitive light source on the image sensor array is in a first ring shape, a second imaging range of the second photosensitive light source on the image sensor array is in a second ring shape,
the first ring shape has only two intersection points with the second ring shape, and two closest points respectively on an inner circle of the first ring shape and an inner circle of the second ring shape are a first point and a second point, and an imaging range in a rectangle shape formed by four sides is used for imaging the texture, taking the two intersection points, the first point and the second point as midpoints of the four sides respectively, or
an imaging range formed in a range covered by either of the first ring shape and the second ring shape is used for imaging the texture.

13. The texture recognition device according to claim 2, wherein the opposite substrate comprises a black matrix layer, the black matrix layer comprises a plurality of first black matrix regions exposing a plurality of sub-pixel units and a plurality of second black matrix regions exposing a plurality of image sensors, a first light filter pattern is provided in each of the first black matrix regions, the first light filter pattern is configured to form monochromatic light, a second light filter pattern is provided in each of the second black matrix regions, and the second light filter pattern is configured to filter the light emitted from the light source array and then reflected to the image sensor array by the texture.

14. The texture recognition device according to claim 13, wherein the second light filter pattern is configured to absorb light with a wavelength range of 600 nm to 900 nm.

15. The texture recognition device according to claim 1, further comprising a controller, wherein the controller is configured to determine a position of the first region according to a touch position of the texture on the touch side, and control the light valve structure, so as to provide the first photosensitive light source.

16. The texture recognition device according to claim 15, wherein the controller is further configured to acquire a touch area of the texture on the touch side, so as to determine a size of the first region and a count of the first region.

17. The texture recognition device according to claim 1, wherein a size of the second region is larger than a size of the first region, a first imaging range of the first photosensitive light source on the image sensor array is in a first ring shape, a second imaging range of the second photosensitive light source on the image sensor array is in a second ring shape, and the second ring shape at least partially covers a ring center part of the first ring shape.

18. The texture recognition device according to claim 17, wherein the light valve structure is further configured to control a third region different from both of the first region and the second region to be in a light transmission state to allow light emitted from the light source array to pass through the third region in the light transmission state to form a third photosensitive light source, and is configured to allow the first region and the third region to be in the light transmission state at same time;

a size of the third region is equal to the size of the first region, a third imaging range of the third photosensitive light source on the image sensor array is in a third ring shape, and the second ring shape further at least partially covers a ring center part of the third ring shape.

19. A driving method of a texture recognition device, wherein the texture recognition device has a touch side and comprises:

a light source array;

an image sensor array configured to receive light emitted from the light source array and then reflected to the image sensor array by a texture for a texture image collection; and a light valve structure which is on a side, close to the touch side, of the light source array;

the driving method comprises:

controlling a first region of the light valve structure to be in a light transmission state according to a control signal, so as to allow light emitted from the light source array to pass through the first region in the light transmission state to form a first photosensitive light source, wherein the first photosensitive light source forms a first imaging range on the image sensor array, and the first imaging range is used for imaging the texture;

the driving method further comprises:

controlling a second region to be in a light transmission state according to a control signal, so as to allow light emitted from the light source array to pass through the second region in the light transmission state to form a second photosensitive light source, wherein the second region is different from the first region, and the first region and the second region are in the light transmission state at different time;

the second photosensitive light source forms a second imaging range on the image sensor array, and both the second imaging range and the first imaging range are used for imaging the texture.

* * * * *